US007777497B2

(12) United States Patent
Albert-Lebrun et al.

(10) Patent No.: US 7,777,497 B2
(45) Date of Patent: Aug. 17, 2010

(54) METHOD AND SYSTEM FOR TRACKING SCATTERING PARAMETER TEST SYSTEM CALIBRATION

(75) Inventors: Xavier M. H. Albert-Lebrun, Cambridge (CA); Mario Lisi, Kitchener (CA); Charles Van Lingen, Sheffield (CA); Robert Christopher Peach, Cambridge (CA)

(73) Assignee: Com Dev International Ltd., Cambridge (CA)

( * ) Notice: Subject to any disclaimer, the term of this patent is extended or adjusted under 35 U.S.C. 154(b) by 447 days.

(21) Appl. No.: 12/015,931

(22) Filed: Jan. 17, 2008

(65) Prior Publication Data
US 2009/0184721 A1 Jul. 23, 2009

(51) Int. Cl.
*G01R 35/00* (2006.01)
(52) U.S. Cl. ................... 324/601; 324/638; 702/107
(58) Field of Classification Search ................. 324/638; 702/107
See application file for complete search history.

(56) References Cited

U.S. PATENT DOCUMENTS

| | | | |
|---|---|---|---|
| 4,982,164 A | 1/1991 | Schiek et al. |
| 5,028,131 A | 7/1991 | Dunsmore |
| 5,034,708 A | 7/1991 | Adamian et al. |
| 5,313,166 A | 5/1994 | Eul et al. |
| 5,434,511 A | 7/1995 | Adamian et al. |
| 5,440,236 A | 8/1995 | Schiek et al. |
| 5,442,296 A | 8/1995 | Schiek et al. |
| 5,467,021 A | 11/1995 | Adamian et al. |
| 5,537,046 A | 7/1996 | Adamian et al. |
| 5,548,221 A | 8/1996 | Adamian et al. |
| 5,548,538 A | 8/1996 | Grace et al. |
| 5,552,714 A | 9/1996 | Adamian et al. |

(Continued)

FOREIGN PATENT DOCUMENTS

EP 0412357 B1 11/1994

OTHER PUBLICATIONS

Tippet, "A Rigorous Technique for Meausuring the Scatting Matrix . . . ", IEEE Transactions on Microwave Theory and Techniques, May 1982, pp. 661-666, vol. MTT-30, No. 5.

(Continued)

*Primary Examiner*—Timothy J Dole
*Assistant Examiner*—John Zhu
(74) *Attorney, Agent, or Firm*—Isis E. Caulder; Bereskin & Parr LLP

(57) ABSTRACT

Embodiments describe methods of correcting S-parameter measurements for a DUT. The method includes coupling at least one tracking module associated with a set of electrical standards to a S-parameter measurement device to form a test system. An initial calibration for the test system is then determined. This may include measuring the S-parameters of the electrical standards, generating a calibration along a calibration plane, generating a calibration along a correction plane and determining at least one error adapter from the calibrations. The DUT is coupled to the test system and the S-parameters of the DUT are measured. Changes in the initial calibration are tracked using the tracking modules. Tracking may include measuring the S-parameters of the electrical standards, generating a correction plane calibration and generating a corrected calibration plane calibration from the correction plane calibration and the error adapter(s). The measured S-parameters are corrected using the tracked changes.

25 Claims, 9 Drawing Sheets

U.S. PATENT DOCUMENTS

| | | | |
|---|---|---|---|
| 5,578,932 A | 11/1996 | Adamian | |
| 5,608,330 A | 3/1997 | Heuermann et al. | |
| 5,666,059 A | 9/1997 | Heuermann et al. | |
| 5,748,000 A | 5/1998 | Blackham | |
| 5,784,299 A | 7/1998 | Evers et al. | |
| 6,018,246 A | 1/2000 | Dunsmore et al. | |
| 6,060,888 A | 5/2000 | Blackham et al. | |
| 6,081,125 A | 6/2000 | Krekels et al. | |
| 6,147,501 A | 11/2000 | Chodora | |
| 6,188,968 B1 | 2/2001 | Blackham | |
| 6,232,760 B1 | 5/2001 | Eckert | |
| 6,300,775 B1 | 10/2001 | Peach et al. | |
| 6,396,285 B1 | 5/2002 | Blackham | |
| 6,417,674 B1 | 7/2002 | Rowell, Jr. et al. | |
| 6,643,597 B1 | 11/2003 | Dunsmore | |
| 6,690,722 B1 | 2/2004 | Dunsmore et al. | |
| 6,768,390 B1 | 7/2004 | Dunsmore et al. | |
| 6,823,276 B2 | 11/2004 | Blackham et al. | |
| 6,836,743 B1 | 12/2004 | Blackham et al. | |
| 6,914,436 B2 | 7/2005 | Liu et al. | |
| 6,920,407 B2 | 7/2005 | Adamian et al. | |
| 6,937,109 B2 | 8/2005 | Tanbakuchi et al. | |
| 6,965,241 B1 | 11/2005 | Liu et al. | |
| 6,970,000 B2 | 11/2005 | Evers et al. | |
| 6,995,571 B1 | 2/2006 | Liu et al. | |
| 7,013,229 B2 | 3/2006 | Wong et al. | |
| 7,019,536 B1 | 3/2006 | Anderson et al. | |
| 7,038,465 B2 | 5/2006 | Dunsmore et al. | |
| 7,054,780 B2 | 5/2006 | Dunsmore et al. | |
| 7,061,254 B1 | 6/2006 | Shoulders et al. | |
| 7,075,312 B2 | 7/2006 | Fabry et al. | |
| 7,076,382 B2 | 7/2006 | Reichel et al. | |
| 7,088,087 B2 | 8/2006 | Dunsmore | |
| 7,124,049 B2 | 10/2006 | Wong et al. | |
| 7,148,702 B2 | 12/2006 | Wong et al. | |
| 7,161,358 B1 | 1/2007 | Tanbakuchi et al. | |
| 7,170,297 B1 | 1/2007 | Dunsmore | |
| 7,221,245 B2 | 5/2007 | Tanbakuchi et al. | |
| 7,231,308 B2 | 6/2007 | Dunsmore et al. | |
| 7,235,982 B1 * | 6/2007 | Shoulders | 324/638 |
| 7,248,033 B2 | 7/2007 | Anderson et al. | |
| 2004/0251922 A1 | 12/2004 | Martens et al. | |
| 2005/0030047 A1 | 2/2005 | Adamian | |
| 2005/0256658 A1 | 11/2005 | Anderson | |
| 2006/0043978 A1 | 3/2006 | Simon | |
| 2008/0018342 A1 | 1/2008 | Hiebel | |

OTHER PUBLICATIONS

Dropkin, "Comments on: "A Rigouourous Technique for Measuring the Scattering . . . "", IEEE Transactions on Microwave Theory and Techniques, Jan. 1983, pp. 79-81, vol. 31.

Lil, "Comments on: "A Rigourous Technique for Measuring the . . . "", IEEE Transactions on Microwave Theory and Techniques, Mar. 1985, pp. 286-287, vol. MTT-33, No. 3.

Elmore, "De-Embedded Measurements Using the HP 8510 Microwave Network Analyzer", ARFTG-Conference Digest-Spring, 25th ARFTG, Jun. 1985, pp. 124-143, vol. 7.

"Introducing e-trak Smart RF Switch Matrices", Jun. 12, 2006.

"Printed Version of PNA Help", pp. 1898 to 1964, Nov. 2006.

European Search Report dated May 28, 2009.

* cited by examiner

METHOD AND SYSTEM FOR TRACKING SCATTERING PARAMETER TEST SYSTEM CALIBRATION

FIELD

The described embodiments relate to systems and methods for correcting scattering parameter measurements to account for calibration drift. More particularly, the described embodiments relate to tracking scattering parameter test system calibration and correcting scattering parameter measurements to account for any calibration drift.

BACKGROUND

Radio frequency (RF) and microwave devices are typically characterized by an N by N matrix of scattering parameters (S-parameters) where N is the number of ports of the RF or microwave device. Each S-parameter, denoted $S_{xy}$, is the ratio of the output signal at port x to the incident signal at port y when no other signals are incident on the RF or microwave device. For example, the ratio of the output signal at port 2 to the incident signal at port 1 is designated as $S_{21}$.

S-parameters are typically measured by a S-parameter measurement device such as a network analyzer. Most network analyzers only have two measurement ports, although there are network analyzers available with four or more measurement ports. To accommodate a multi-port device under test (DUT) with a two-port network analyzer, the two-port network analyzer is often connected to a programmable switch matrix that contains at least as many ports as the number of ports on the DUT. The network analyzer measures the S-parameters of the DUT by configuring the switch matrix to couple two DUT ports to the two measurement ports. The remaining DUT ports are terminated in the switch matrix.

Regardless of the type of S-parameter measurement device used, and whether a switch matrix is used, the S-parameter measurement system will inevitably include hardware imperfections that can produce measurement errors if they are not accounted for in the measurements. The errors can either be systematic or random. Systematic errors are caused by imperfections in the test equipment and test setup. For example, systematic errors can result from directivity effects in the couplers, cable losses and mismatches between the S-parameter test system and the DUT. These errors can typically be characterized through calibration and mathematically removed during the measurement process. For a standard two-port network analyzer measurement, there is a generally accepted calibration model that is used to remove the effects of the following twelve systematic errors:

forward directivity(EDF)
forward crossisolation(EXF)
forward sourcematch(ESF)
forward reflectiontracking(ERF)
forward load match(ELF)
forward transmissiontracking(ETF)
reversedirectivity(EDR)
reversecrossisolation(EXR)
reversesourcematch(ESR)
reversereflectiontracking(ERR)
reverseloadmatch(ELR)
reversetransmissiontracking(ETR)

In contrast, random errors vary randomly as a function of time and thus cannot be removed by calibration. The main contributors to random errors are instrument noise, switch repeatability and connector repeatability.

Even if the system is calibrated, all of the errors may not be removed because after calibration the system may be subject to a number of changes that cause calibration drift. Specifically, changes in temperature, changes due to switching in the RF or microwave path and movement in the cables. When electromechanical RF or microwave switches are used on the test system, their RF or microwave characteristics change when they are actuated. Cable movement also affects the system characteristics and the higher the frequency the more significant the affects. Accordingly, if the calibration drift is not accounted for then the S-parameter measurements will lose their accuracy over time.

Calibration drift is typically minimized or eliminated by one of the following methods: use of silicon dioxide ($SiO_2$) test cables to minimize test system loss and improve phase stability versus temperature; use of high repeatability switches; or, use of reference cables to compensate the effect of systematic changes. Each of these techniques, however, is associated with a particular limitation. Specifically, high repeatability switches are expensive and degrade substantially in repeatability over life. Furthermore, while silicon dioxide cables are very stable over temperature, they do exhibit changes as a function of temperature. In addition, the effectiveness of these methods is significantly reduced as the test frequencies reach the Ka band or when the test system losses increase, for example, when long test cables are used to connect the test system to the DUT.

However, there are many applications that require long cables between the test system and the DUT. For example, it may be necessary to put the DUT into a specific environment such as inside a vacuum chamber, a thermal chamber or an anechoic chamber. It also may be necessary to test the DUT "in situ" such as mechanically integrated into a large assembly. Accordingly, there is a need for a system that can dynamically correct S-parameter measurements to account for calibration drift.

SUMMARY

The embodiments described herein provide in one aspect a method of correcting S-parameter measurements for a device under test (DUT) using a S-parameter measurement device. The method includes coupling a tracking module to a port of the S-parameter measurement device to form a S-parameter test system wherein the tracking module is associated with a plurality of electrical standards characterized by a first set of S-parameters; determining an initial calibration for the S-parameter test system; coupling the device under test (DUT) to the S-parameter test system and measuring the S-parameters of the device under test (DUT); tracking changes in the initial calibration during measurement using the plurality of electrical standards of the tracking module; and correcting the measured S-parameters using the tracked changes.

Determining the initial calibration may include determining a second set of S-parameters for the plurality of electrical standards; determining a one-port calibration along a calibration plane wherein the calibration plane lies between the tracking module and the device under test (DUT); determining a first one-port calibration along a correction plane based on the first set of S-parameters and the second set of S-parameters wherein the correction plane lies between the tracking module and the S-parameter measurement device; and calculating an error adapter based on the one-port calibration along the calibration plane and the first one-port calibration along the correction plane.

Tracking changes in the initial calibration may include determining a third set of S-parameters for the plurality of electrical standards; determining a second one-port calibration along the correction plane based on the first set of S-parameters and the third set of S-parameters; and generating a corrected one-port calibration along the calibration plane based on the second one-port calibration along the correction plane and the error adapter.

The embodiments described herein provide in another aspect a method of correcting S-parameter measurements for a device under test (DUT) using a S-parameter measurement device. The method includes coupling a plurality of tracking modules to a plurality of ports of the S-parameter measurement device to form a S-parameter test system, each tracking module being associated with a set of electrical standards characterized by a first set of S-parameters; determining an initial calibration for the S-parameter test system; coupling the device under test (DUT) to the S-parameter test system and measuring the S-parameters of the device under test (DUT) using the S-parameter test system; tracking changes in the initial calibration during measurement using the electrical standards of the tracking modules; and correcting the measured S-parameters using the tracked changes.

Determining the initial calibration may include determining a second set of S-parameters for each set of electrical standards; generating an initial full two-port calibration along a calibration plane wherein the calibration plane lies between the tracking modules and the device under test (DUT); generating a first one-port calibration along a correction plane for each port of interest of the device under test (DUT) based on the first set of S-parameters and the second set of S-parameters wherein the correction plane lies between the tracking modules and the S-parameter measurement device; and calculating an error adapter for each port of interest of the device under test (DUT) based on the initial full two-port calibration along the calibration plane and the first one-port calibrations along the correction plane.

Tracking changes in the initial calibration may include determining a third set of S-parameters for each set of electrical standards; generating a second one-port calibration along the correction plane for each port of interest of the device under test (DUT) based on the first set of S-parameters and the third set of S-parameters; determining a full two-port calibration along the correction plane based on the second one-port calibrations along the correction plane and the initial full two-port calibration along the calibration plane; and generating a corrected full two-port calibration along the calibration plane based on the full two-port calibration along the correction plane and the error adapters Further aspects and advantages of the embodiments described will appear from the following description taken together with the accompanying drawings.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

Figure 1:
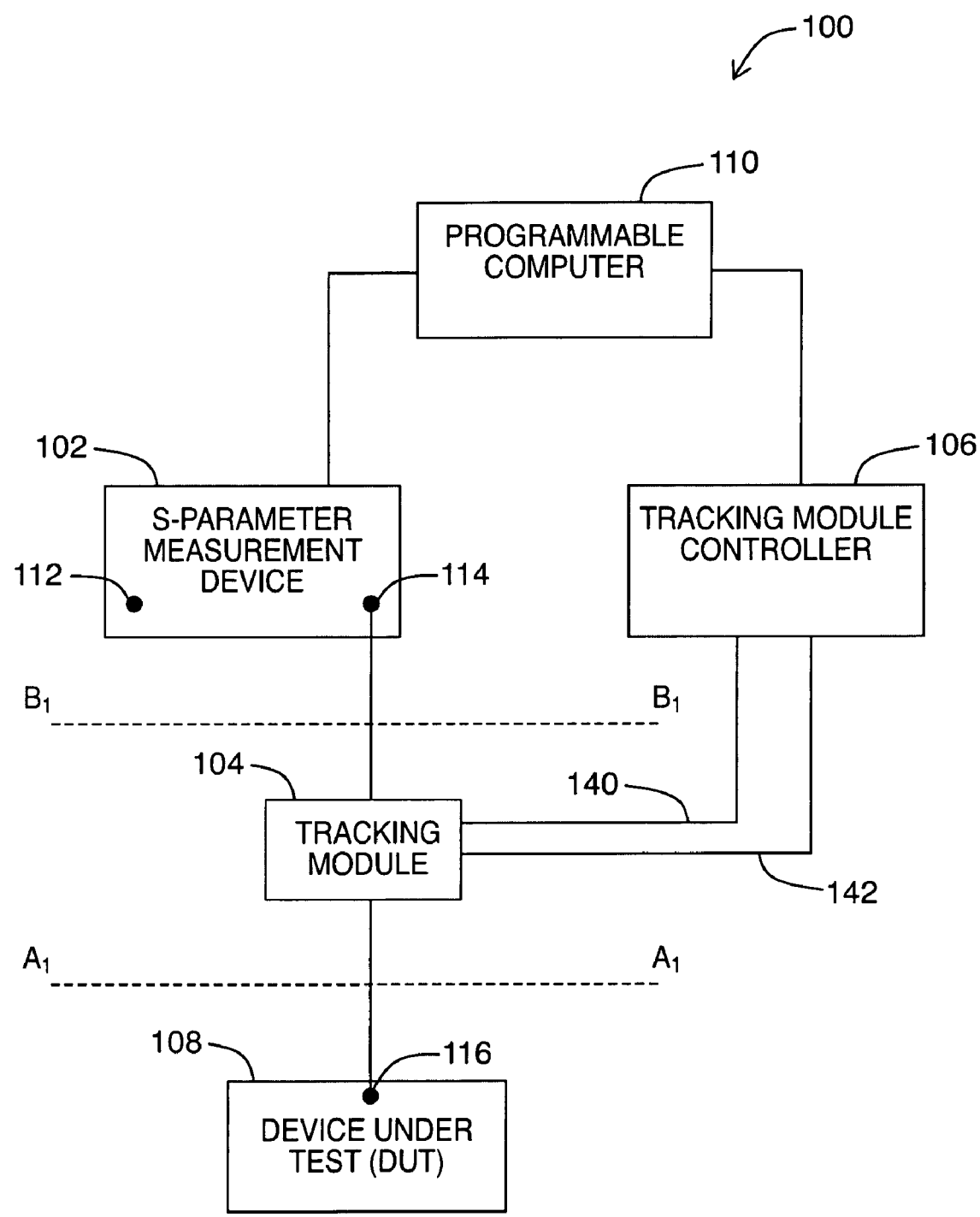
FIG. 1 is a block diagram of a system for measuring S-parameters of a one-port device under test (DUT) in accordance with at least one embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

Reference is now made to FIG. 1, in which a system 100 for dynamically correcting S-parameters measurements of a one-port DUT 108 in accordance with an embodiment is illustrated. The system 100 includes a S-parameter measurement device 102, a tracking module 104, a tracking module controller 106, a one-port DUT 108 and a programmable computer 110. Without limitation, the programmable computer may be a mainframe computer, server, personal computer, laptop, and the like.

The one-port DUT 108 may be an RF or microwave device with one input/output port 116, or the one-port DUT 108 may be an RF or microwave device with multiple input/output ports where all of the ports but one are terminated because the full S-parameter matrix for that device is not required.

The S-parameter measurement device 102 measures the S-parameters of the one-port DUT 108 by applying a signal to the DUT port 116 and measuring the amplitude and phase of the reflected wave. The S-parameter measurement device 102 may be a vector network analyzer (VNA) or any other similar vector measurement device, such as a vector voltmeter (VVM), with at least one measurement port. A vector measurement device can be described as a device that measures the magnitude and phase of the S-parameters and can be contrasted with a scalar measurement device which can only measure the magnitude of the S-parameters.

While the S-parameter measurement device 102 shown in FIG. 1 has two measurement ports 112 and 114, it should be understood that a S-parameter measurement device with one measurement port, or more than two measurement ports (e.g. four measurement ports) could be used. The S-parameter measurement device 102 is coupled to, and controlled by, the programmable computer 110.

The programmable computer 110 is used to run calibration software that interacts with the S-parameter measurement device 102 and the tracking module controller 106 to measure and correct S-parameters. The calibration software instructs the programmable computer 110 to send three types of messages to the S-parameter measurement device 102—configuration messages, start messages and retrieval messages. A configuration message includes all of the necessary parameters to perform a set of S-parameter measurements. The parameters may include but are not limited to the start/stop frequency, number of frequency points and the intermediate frequency. Once a configuration message has been sent the calibration software instructs the programmable computer 110 to send a start message to instruct the S-parameter measurement device 102 to perform S-parameter measurements using the parameters sent in the configuration message. Once the S-parameter measurements are complete the calibration software instructs the programmable computer 110 to send the S-parameter measurement device 102 a requisition message asking for the S-parameter measurements. In response the S-parameter measurement device 102 sends the programmable computer 110 the S-parameter measurements.

The calibration software also communicates with the tracking module controller 106. Typically the calibration software only sends one type of message to the tracking module controller 106 and this is a command message. This will be described in further detail in relation to the tracking module controller 106. The calibration software may be stored in permanent memory on the programmable computer 110 such as on a hard disk or it may be stored on a removable memory device.

In one embodiment the programmable computer 110 is coupled to the S-parameter measurement device 102 and the tracking module controller 106 via a communications cable such as an Ethernet cable and communicates to the S-parameter measurement device 102 and the tracking module controller 106 using the TCP/IP protocol. However, other suitable communications networks and protocols may be used.

The tracking module 104 is connected between the S-parameter measurement device 102 and the one-port DUT 108 and is used to track the test system calibration changes so that the S-parameter measurements can be corrected to reflect any changes.

Figure 2:
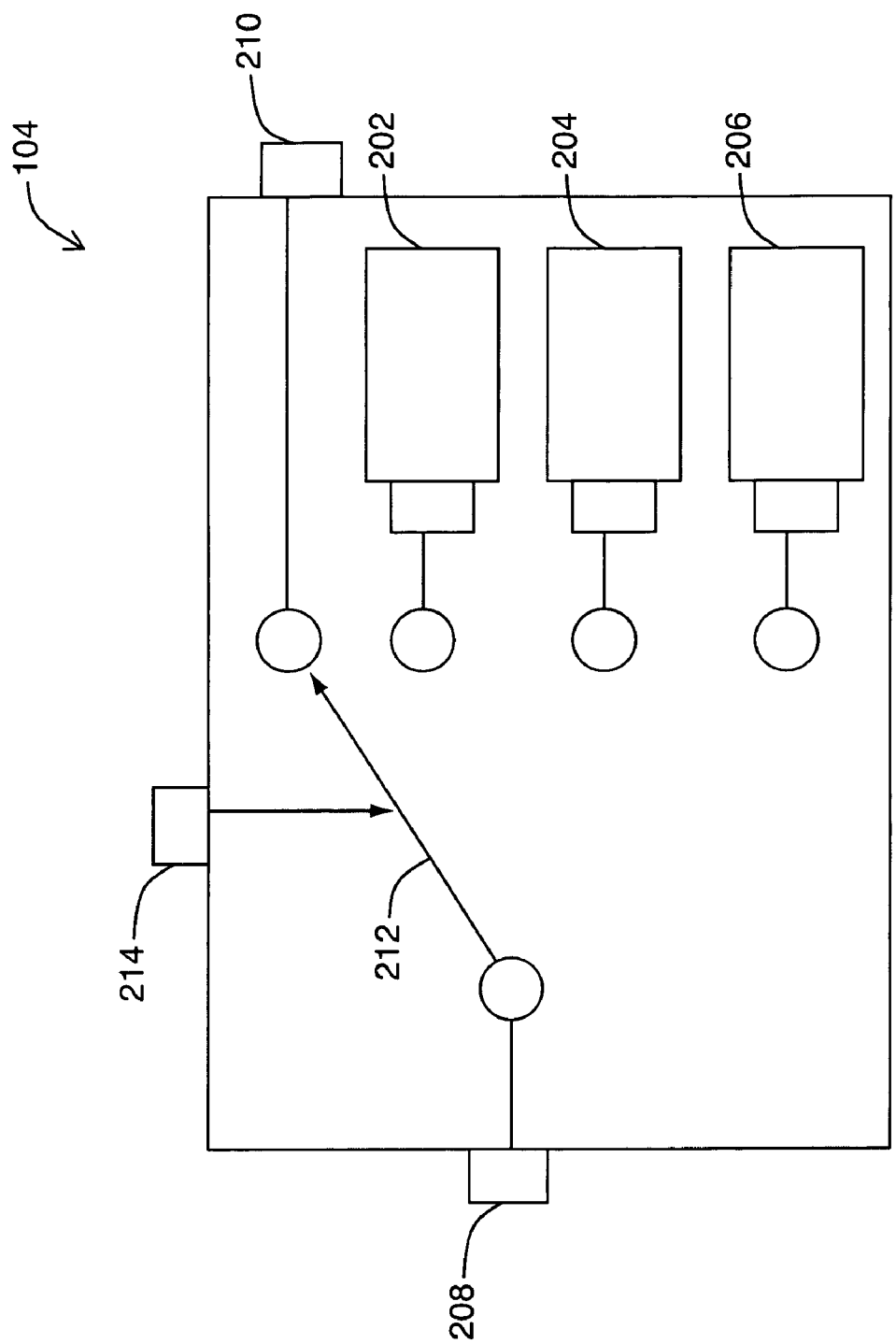
FIG. 2 is a block diagram of the tracking module of FIG. 1 in accordance with at least one embodiment.

Reference is now made to FIG. 2, in which a block diagram of a tracking module 104 in accordance with at least one embodiment is illustrated. The tracking module 104 includes three electrical standards 202, 204 and 206, a first port 208, a second port 210, a switch 212 and a network control port 214. The accuracy of the tracking module 104 may be enhanced by increasing the number of electrical standards. However, increasing the number of electrical standards also increases the cost of the tracking module 104.

The electrical standards 202, 204 and 206 may be any combination of distinct electrical standards. However, the more different the electrical standards are from each other, the more accurate the tracking. In one embodiment the electrical standards 202, 204 and 206 are an open, short and load. The electrical standards 202, 204 and 206 may be NIST (National Institute of Standards and Technology) traceable standards.

As shown in FIG. 2, the switch 212 can be set to one of four positions: (1) connecting the first port 208 to the first electrical standard 202; (2) connecting the first port 208 to the second electrical standard 204; (3) connecting the first port 208 to the third electrical standard 206; and (4) connecting the first port 208 to the second port 210.

When the switch 212 connects the first port 208 to the second port 210, the switch 212 is said to be in the through position. The switch 212 must be in the through position to enable the S-parameter measurement device 102 to measure the S-parameters of the one-port DUT 108. The other three positions will be referred to as the standards positions. The switch 212 is only set to one of the three standards positions during initial calibration or when the tracking module 104 is tracking the calibration drift. The switch 212 may be implemented using positive intrinsic negative (PIN) diodes, microelectromechanical systems (MEMS), field-effect transistors (FET) or electromechanical switches.

The network control port 214 of the tracking module 104 is coupled to the tracking module controller 106 via a power supply line 140 and a communications line 142. The tracking module controller provides power to the tracking module 104 through the power supply line 140.

The tracking module controller 106 also acts as the interface between the programmable computer 110 and the tracking module 104. The tracking module controller 106 receives and decodes commands from the programmable computer 110 and then sends a command signal to the tracking module 104 via the communications line 142 to set the position of the switch 212. In one embodiment the communication line 142 between the tracking module controller 106 and the tracking module 104 includes several digital communications lines which can be set to 1 or 0. The position of the switch 212 is selected by setting the communication lines to particular values. For example, where there are two digital communications lines, the first standards position may be selected by setting both lines to 0 and the second standards position may be selected by setting the first line to 0 and the second line to 1. The tracking module controller 106 may be a microprocessor, a field-programmable gate array (FPGA) or any other similar device.

The tracking module 104 is characterized by seven S-parameters. Four S-parameters ($S_{11}$, $S_{12}$, $S_{21}$, $S_{22}$) for the through position and one S-parameter ($S_{11}$) for each of the three standards positions as measured from the first port 208. At the time the tracking module 104 is manufactured the S-parameters of the tracking module 104 are measured. These S-parameters will be referred to as the manufacturing S-parameters of the tracking module 104. The manufacturing S-parameters are loaded into the programmable computer 110 prior to using the tracking module 104 in the test system.

Figure 3:
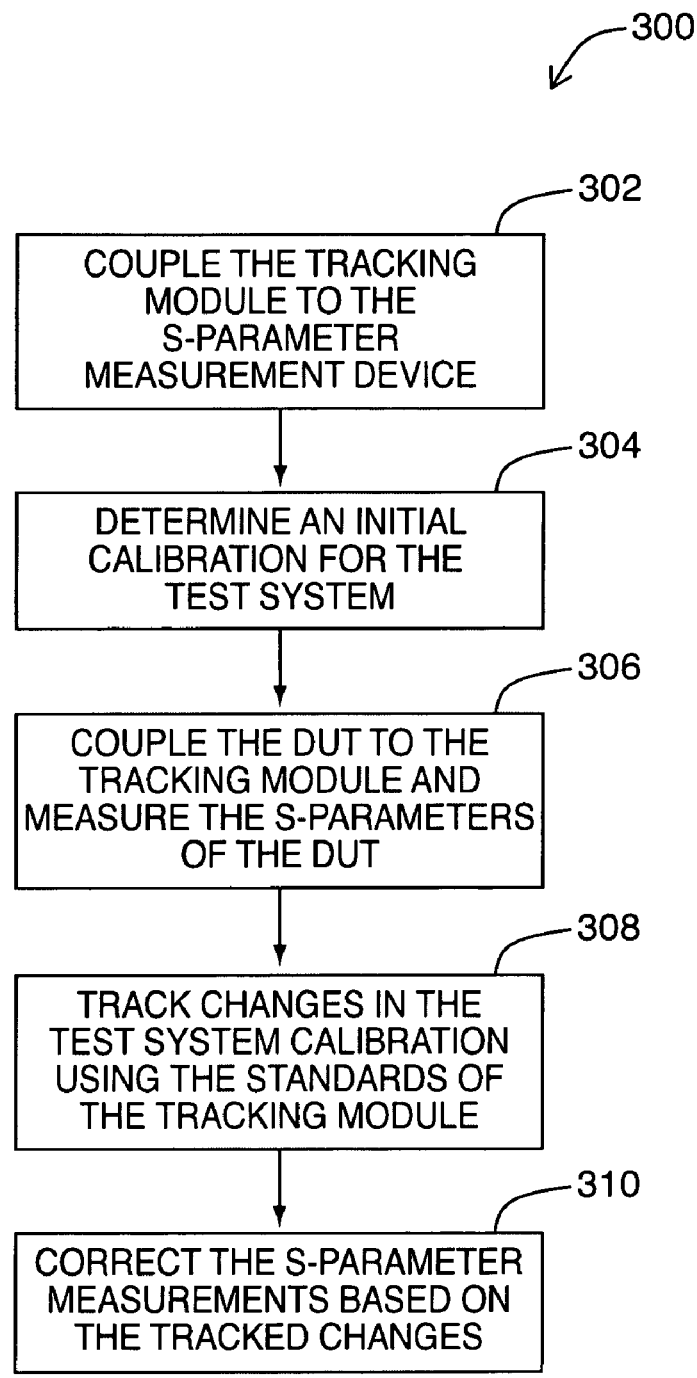
FIG. 3 is a flowchart illustrating a method of correcting S-parameter measurements of a one-port device under test (DUT) in accordance with at least one embodiment.

Reference is now made to FIG. 3, in which a flowchart of a method 300 to dynamically correct S-parameter measurements of a one-port DUT 108 using the system of FIG. 1 is illustrated. At (302), the first port 208 of the tracking module 104 is coupled to one of the measurement ports 112 and 114 of the S-parameter measurement device 102 using standard RF or microwave connectors. Together the S-parameter measurement device 102 and the tracking module 104 form a one-port S-parameter test system. Once the tracking module 104 is coupled to the S-parameter measurement device 102, at (304) an initial calibration for the one-port S-parameter test system is determined.

In one embodiment, the determination of the initial calibration includes four stages. In the first stage, the S-parameter measurement device 102 measures the S-parameters of the three electrical standards 202, 204 and 206 of the tracking module 104. To enable the S-parameter measurement device 102 to measure the electrical standards 202, 204 and 206 of the tracking module 104, the tracking module 104 is switched from the through position to each of the three standards positions in succession. These S-parameters will be referred to as the calibration S-parameters of the tracking module 104.

In the second stage of the initial calibration, a one-port calibration along the plane $A_1$-$A_1$ is generated. Plane $A_1$-$A_1$ is referred to as the calibration plane and, as shown in FIG. 1, lies between the tracking module 104 and the one-port DUT 108. Typically, calibration involves a process known as vector error correction. In vector error correction systematic errors are characterized by measuring known calibration standards, and then the measured data is used to calculate an error term model. The error term model is then used to remove the effects of the systematic errors from subsequent S-parameter measurements. Specifically, a one-port calibration is generated by determining one-port error terms according to a one-port error term model.

A one-port error term model can measure and remove three systematic error terms (forward directivity (EDF), forward source match (ESF), and forward reflection tracking (ERF)) from S-parameter measurements. These three error terms are derived from a general equation that can be solved in terms of three simultaneous equations with three unknowns. One way to obtain these three equations is to measure three known calibration standards (i.e. an open, short and load). Solving the equations generates the three systematic error terms and makes it possible to derive the DUT's actual S-parameters.

Figure 4:
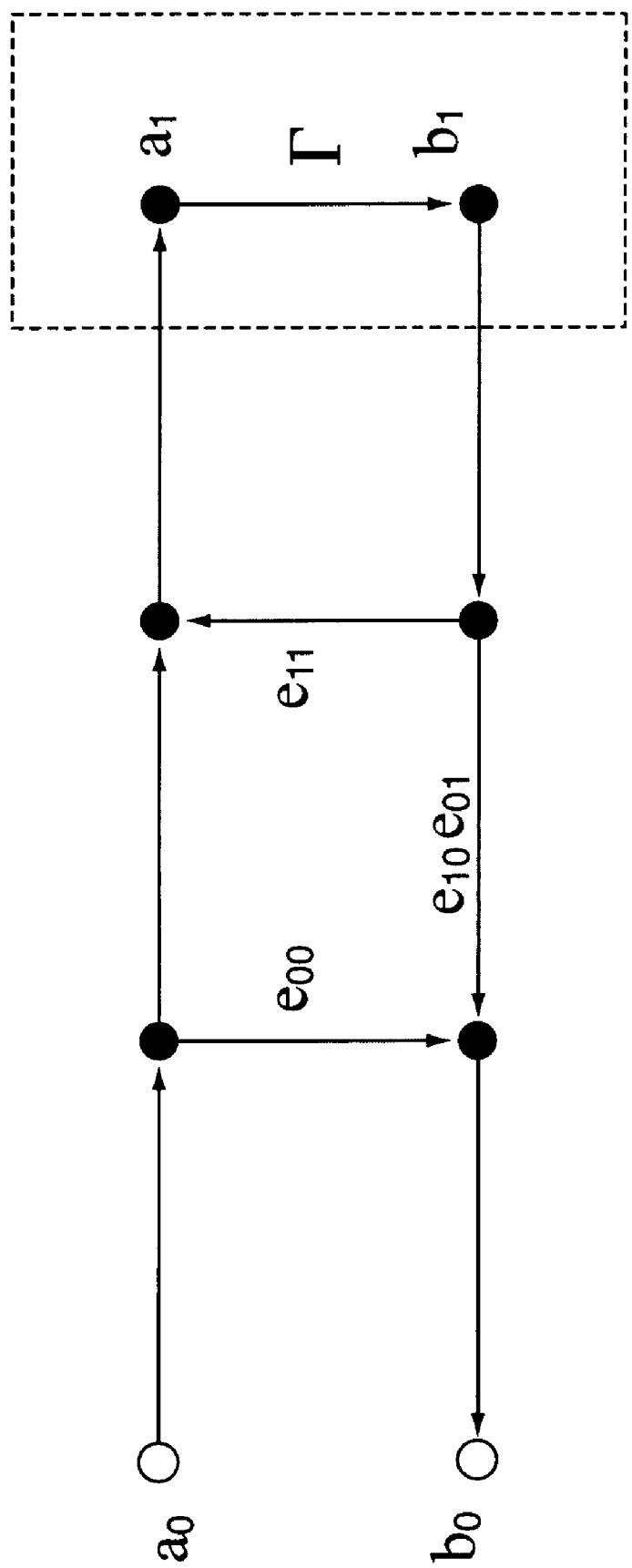
FIG. 4 is a signal flow graph of a one-port error term model.

Reference is now made to FIG. 4, in which a well-known one-port error term model is illustrated in signal flow graph form. A flow graph is used to represent and analyze the transmitted and reflected signals from a device. Directed lines in the flow graph represent the signal flow through a device. In FIG. 4, the signal at node $a_0$ is the measured incident signal, the signal at node $b_0$ is the measured reflected signal, the signal at node $a_1$ is the incident signal at port 1 of the DUT and the signal at node $b_1$ is the reflected signal at port 1 of the DUT. The error terms are represented by $e_{00}$ (forward directivity), $e_{11}$ (forward source match) and $e_{10}e_{01}$ (forward reflection tracking). $\Gamma$ is the actual DUT reflection coefficient.

The measured reflection coefficient $\Gamma_M$ can be described by the following equation:

$$\Gamma_M = \frac{b_0}{a_o} = \frac{e_{00} - \Delta_e \Gamma}{1 - e_{11}\Gamma} = e_{00} + \Gamma\Gamma_M e_{11} - \Gamma\Delta_e \quad (1)$$

where $\Delta_e$ is equal to $e_{00}e_{11} - (e_{10}e_{01})$.

If three reflection coefficients ($\Gamma_1$, $\Gamma_2$, $\Gamma_3$) are known and the resultant three reflection coefficients ($\Gamma_{M1}$, $\Gamma_{M2}$, $\Gamma_{M3}$) are measured then there are three equations to solve for $e_{00}$, $e_{11}$ and $\Delta_e$:

$$\Gamma_{M1} = e_{00} + \Gamma_1\Gamma_{M1}e_{11} - \Gamma_1\Delta_e \quad (2)$$

$$\Gamma_{M2} = e_{00} + \Gamma_2\Gamma_{M2}e_{11} - \Gamma_2\Delta_e \quad (3)$$

$$\Gamma_{M3} = e_{00} + \Gamma_3\Gamma_{M3}e_{11} - \Gamma_3\Delta_e \quad (4)$$

If the three error terms are known, equation (1) can be solved for the actual reflection coefficient $\Gamma$ of the DUT:

$$\Gamma = \frac{\Gamma_M - e_{00}}{\Gamma_M e_{11} - \Delta_e} \quad (5)$$

The one-port calibration along the calibration plane $A_1$-$A_1$ may be determined using a self-calibration kit or an electronic calibration unit.

In the third stage of the initial calibration, a one-port calibration along plane $B_1$-$B_1$ is generated. Plane $B_1$-$B_1$ is referred to as the correction plane and, as shown in FIG. 1, lies between the tracking module 104 and the S-parameter measurement device 102. In one embodiment the one-port calibration along the correction plane $B_1$-$B_1$ is generated from the manufacturing S-parameters and the calibration S-parameters of the tracking module 104. Specifically, the three one-port error terms are determined from equation (2), (3) and (4) using the manufacturing S-parameters as the known reflection coefficients and the calibration S-parameters as the measured reflection coefficients.

In the fourth stage of the initial calibration, an error adapter is calculated from the one-port calibration along the calibration plane $A_1$-$A_1$ and the one-port calibration along the correction plane $B_1$-$B_1$. An error adapter is the representation of the electrical distance between two planes. In this case those two planes are the calibration plane $A_1$-$A_1$ and the correction plane $B_1$-$B_1$. The error adapter may be represented by a set of two-port S-parameters ($S_{11}$, $S_{12}$, $S_{21}$, $S_{22}$). In one embodiment the two-port S-parameters are determined by differencing the one-port calibration along the calibration plane $A_1$-$A_1$ and the one-port calibration along the correction plane $B_1$-$B_1$.

It is known that an adapter can be added to a one-port calibration ($EDF_1$, $ERF_1$, $ESF_1$) to generate a second one-port calibration ($EDF_2$, $ERF_2$, $ESF_2$) using equations (6), (7) and (8) shown below:

$$EDF_2 = EDF_1 + \frac{ERF_1 S_{11}}{1 - ESF_1 S_{11}} \quad (6)$$

$$ERF_2 = \frac{ERF_1 S_{12} S_{21}}{(1 - ESF_1 S_{11})^2} \quad (7)$$

$$ESF_2 = S_{22} + \frac{ESF_1 S_{12} S_{21}}{1 - ESF_1 S_{11}} \quad (8)$$

where $EDF_1$, $ESF_1$ and $ERF_1$ are the original one-port error terms, $EDF_2$, $ESF_2$ and $ERF_2$ are the new one-port error terms and $S_{11}$, $S_{21}$, $S_{12}$, $S_{22}$ represent the S-parameters of the adapter.

Equations (6), (7) and (8) can be rearranged to solve for the following S-parameters of the adapter:

$$S_{11} = \frac{(EDF_2 - EDF_1)}{(ERF_1 + ESF_1(EDF_2 - EDF_1))} \quad (9)$$

$$S_{12} S_{21} = \frac{ERF_2 (1 - ESF_1 S_{11})^2}{ERF_1} \quad (10)$$

$$S_{22} = ESF_2 - \frac{ESF_1 S_{21} S_{12}}{1 - ESF_1 S_{11}} \quad (11)$$

If it is assumed that the adapter is reciprocal then $S_{12}$ is equal to $S_{21}$ and equation (10) can be rearranged to solve for $S_{12}$ and $S_{21}$:

$$S_{12} = \sqrt{\frac{ERF_2 (1 - ESF_1 S_{11})^2}{ERF_1}} = S_{21} \quad (12)$$

The proper sign (+/−) for the square root of the equation $$\frac{ERF_2(1 - ESF_1 S_{11})^2}{ERF_1}$$

(which be referred to simply as X) is determined according to the method set out in U.S. Pat. No. 6,300,775 (Peach et al.) herein incorporated by reference. Specifically, the phase data of X is unwrapped and then extrapolated back to 0 Hz phase. The curves are extrapolated to 0 Hz using a straight line fit. Although such a straight line fit is appropriate for a coaxial system, a more complex extrapolation method would be employed for a waveguide or mixed coaxial/waveguide system. From the plots, the absolute phase of X can be extracted. By knowing the absolute phase at the frequency of choice, the square root of X can be taken using the following expression in complex polar notation:

$$(X_j)^{1/2} = R_j^{1/2} e^{i\theta_j/2}, j=1,2,3,\ldots n \quad (13)$$

where R is the modulus or magnitude of the complex number and θ is the argument or phase of the complex number.

Accordingly, the S-parameters of the error adapter in the fourth stage of the initial calibration can be determined from equations (9), (11), and (12) where $EDF_1$, $ESF_1$ and $ERF_1$ are the one-port error terms of the one-port calibration along the correction plane $B_1$-$B_1$, and $EDF_2$, $ESF_2$ and $ERF_2$ are the one-port error terms of the one-port calibration along the calibration plane $A_1$-$A_1$.

After the initial calibration is determined, at (306) the DUT port 116 is coupled to the second port 210 of the tracking module 104 and the S-parameter of the one-port DUT 108 is measured. The DUT 108 may be coupled to the tracking module 104 by any RF or microwave connectors. To increase the accuracy of the method 300, the tracking module 104 should be situated as close as possible to the DUT 108. This increases the accuracy of the correction because the method 300 can only dynamically correct for calibration drift in the part of the system between the S-parameter measurement device 102 and the tracking module 104. The method 300 cannot correct for drift that occurs between the tracking module 104 and the DUT 108.

Once the S-parameter has been measured, at (308), the tracking module 104 is used to track changes in the initial calibration. In one embodiment tracking the changes in the initial calibration involves three stages. In the first tracking stage, the S-parameter measurement device 102 measures the S-parameters of the electronic standards 202, 204 and 206 of the tracking module 104. These S-parameters will be referred to as the measurement S-parameters of the tracking module 104.

In the second tracking stage, a second one-port calibration along the correction plane $B_1$-$B_1$ is generated. In one embodiment the second one-port calibration is generated from the manufacturing S-parameters and the measurement S-parameters of the tracking module 104. Specifically, the three one-port error terms are determined from equation (2), (3) and (4) using the manufacturing S-parameters as the known reflection coefficients and the measurement S-parameters as the measured reflection coefficients.

In the third tracking stage, a corrected one-port calibration along the calibration plane $A_1$-$A_1$ is generated from the second one-port calibration along the correction plane $B_1$-$B_1$ and the error adapter. In one embodiment the corrected one-port calibration along the calibration plane $A_1$-$A_1$ is generated by adding the error adapter to the second one-port calibration along the correction plane $B_1$-$B_1$. Specifically, the one-port error terms of the corrected one-port calibration along the calibration plane $A_1$-$A_1$ ($EDF_2$, $ESF_2$ and $ERF_2$) are determined from equations (6), (7) and (8) where $EDF_1$, $ESF_1$ and $ERF_1$ are the error terms of the second one-port calibration along the correction plane $B_1$-$B_1$, and $S_{11}$, $S_{12}$, $S_{21}$ and $S_{22}$ are the S-parameters of the error adapter.

After the changes have been tracked, at (310) the measured S-parameters are corrected using the corrected one-port calibration along the calibration plane $A_1$-$A_1$. In one embodiment the actual S-parameters are determined from equation (5) using the measured S-parameters and the error terms of the corrected one-port calibration along the calibration plane $A_5$-$A_5$. The tracking and correction may be performed each time the S-parameters are measured or it may only be performed after a certain threshold has been reached (e.g. after a predetermined amount of time has passed). If tracking and correction is only performed after a certain threshold has been reached, the most recently generated calibration along the calibration plane $A_1$-$A_1$ is used to correct the S-parameter measurements taken between calibration corrections.

Figure 5:
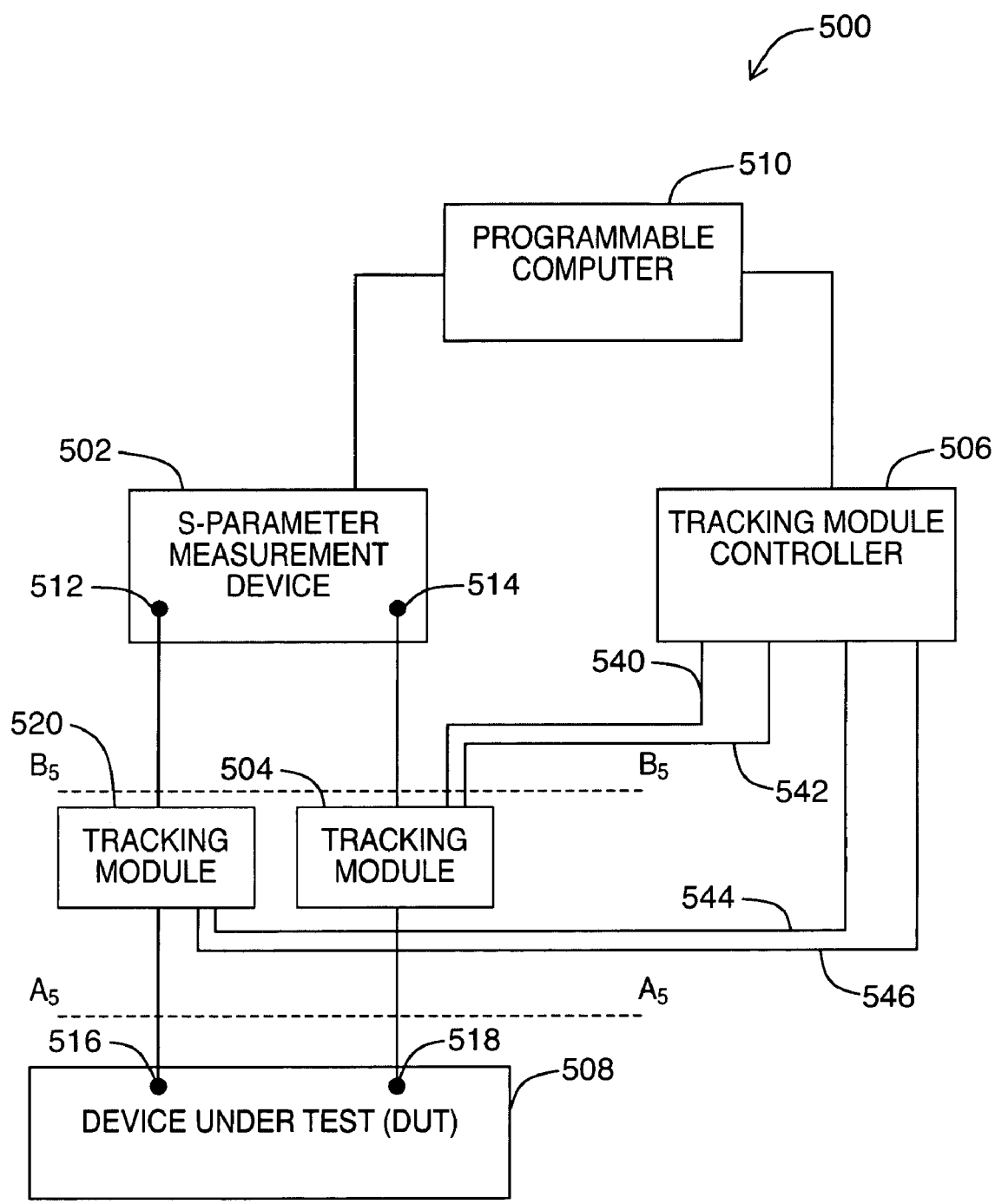
FIG. 5 is a block diagram of a system for measuring the S-parameters of a two-port device under test in accordance with at least one embodiment.

Reference is now made to FIG. 5, in which a system 500 for measuring the S-parameters of a two-port DUT 508 in accordance with an embodiment is illustrated. The system 500 includes a S-parameter measurement device 502, a first tracking module 520, a second tracking module 504, a tracking module controller 506, a two-port device under test (DUT) 508 and a programmable computer 510.

The tracking module controller 506 and the programmable computer 510 are comparable to and operate in a similar fashion to the tracking module controller 106 and the programmable computer 110 of system 100.

The S-parameter measurement device 502 measures all four S-parameters ($S_{11}$, $S_{12}$, $S_{21}$, $S_{22}$) of the two-port DUT 508 by applying a signal to each DUT port 516 and 518 in succession and measuring the amplitude and phase of the reflected and transmitted waves. When the S-parameter measurement device 502 transmits the test signal from the first measurement port 512 these measurements are referred to as the forward measurements. When the S-parameter measurement device 502 transmits the test signal from the second measurement port 514, these measurements are referred to as the reverse measurements. The S-parameter measurement device 502 may be a VNA or any other similar vector measurement device with at least two measurement ports. In the system 500 shown in FIG. 5 the S-parameter measurement device 502 has two measurement ports 512 and 514, however, a S-parameter measurement device with more than two measurement ports (e.g. four measurement ports) could also be used.

The first and second tracking modules 520 and 504 of system 500 include the same components and operate in the same fashion as the tracking module 104 of system 100. As with the tracking module 104 in system 100, the S-parameters of the tracking modules 504 and 520 of system 500 are measured at the time of manufacture and are referred to as the manufacturing S-parameters. The manufacturing S-parameters are loaded into the programmable computer 510 prior to using the tracking modules 504 and 520 in the system.

Figure 6:
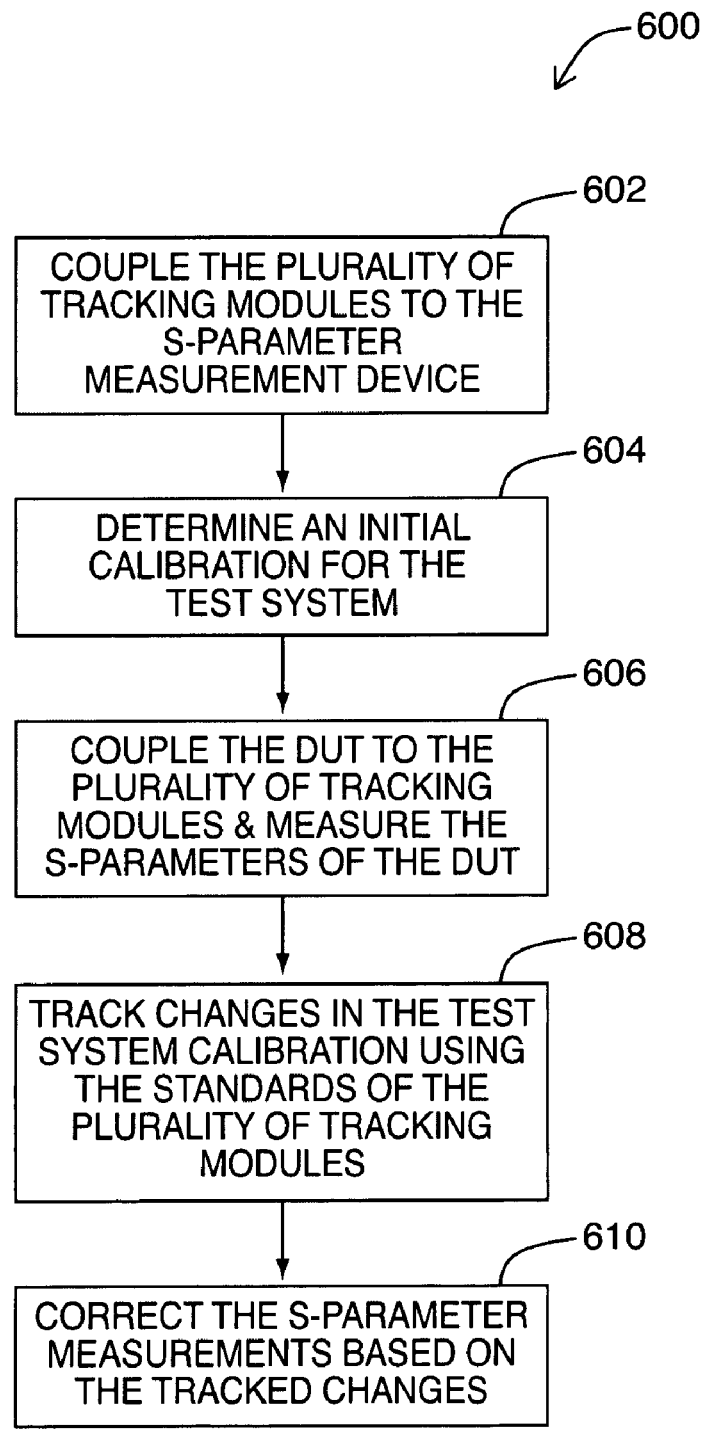
FIG. 6 is a flowchart illustrating a method of correcting S-parameter measurements of a two-port device under test in accordance with at least one embodiment.

Reference is now made to FIG. 6, in which a flowchart of a method 600 to dynamically correct S-parameter measurements of a two-port DUT 508 using the system 500 of FIG. 5 is illustrated. At (602) the first port 208 of the first tracking module 520 is coupled to the first measurement port 512 of the S-parameter measurement device 502 and the first port 208 of the second tracking module 504 is coupled to the second measurement port 514 of the S-parameter measurement device 502. Together the S-parameter measurement device 502 and the first and second tracking modules 520 and 504 form a two-port S-parameter test system. Once the tracking modules 520 and 504 are coupled to the S-parameter measurement device 502, at (604) an initial calibration for the two-port S-parameter test system is determined.

In one embodiment, determining the initial calibration at (604) includes four stages. In the first stage, the S-parameter measurement device 502 measures the S-parameters for the three electrical standards 202, 204 and 206 of the first and second tracking modules 520 and 504. These S-parameters will be referred to as the calibration S-parameters of the first and second tracking modules 520 and 504.

In the second stage of the initial calibration, a two-port calibration along the plane $A_5$-$A_5$ is generated. Plane $A_5$-$A_5$ is referred to as the calibration plane and, as shown in FIG. 5, lies between the tracking modules 520 and 504 and the two-port DUT 508. Generating a two-port calibration involves generating two-port error terms from a two-port error term model.

There are several well-known two-port error term models including the standard 12-term error term model, the 8-term error model and the 16-term error model. The standard 12-term error model is generated by placing a fictitious error adapter containing 6 error-terms in the forward direction between the two-port DUT 508 and the S-parameter measurement device 504. A similar 6-term model is used in the reverse direction. The forward and reverse adapters combine to give four equations containing the four S-parameters of the two-port DUT 508 and 12 error terms. If the 12 error terms are known these four equations can be solved for the actual S-parameters of the two-port DUT 508. Although embodiments will be described in reference to the standard 12-term error model, the methods and systems disclosed are equally applicable to any other type of two-port error term model.

Figure 7A:
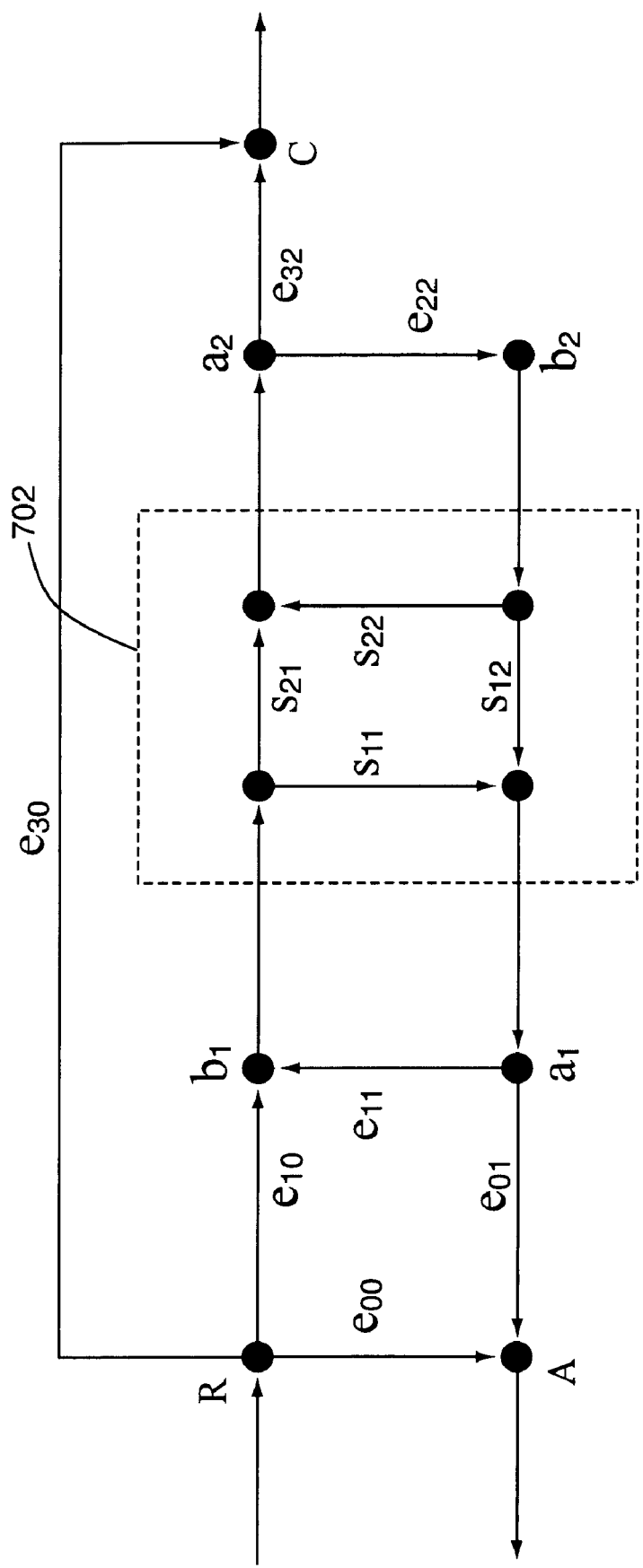
FIGS. 7A and 7B are signal flow graphs of forward and reverse error term models of a 12-term error term model.
Figure 7B:
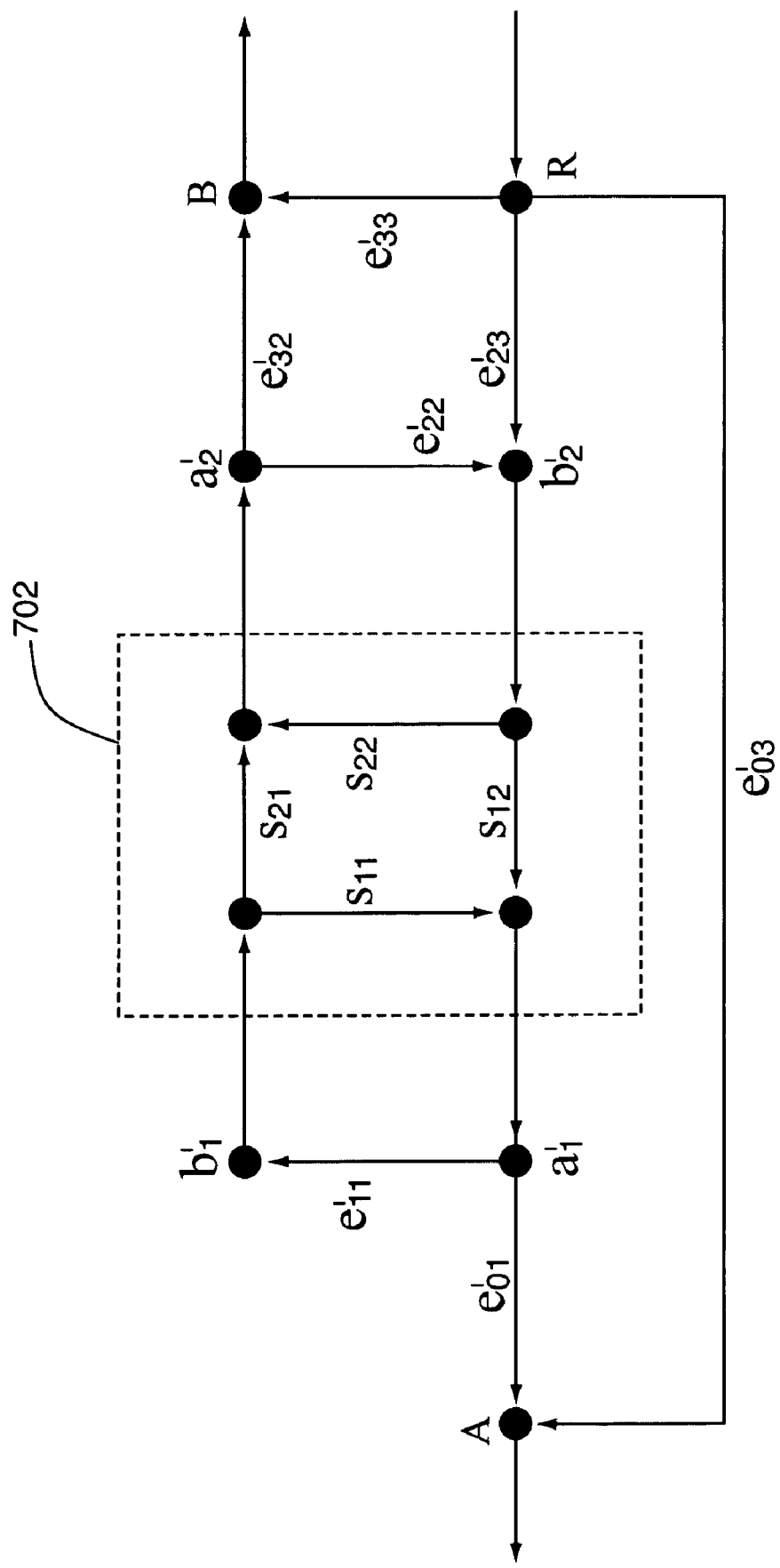

Reference is now made to FIGS. 7A and 7B, in which the forward and reverse 6-term error models are illustrated in signal flow graph form. In FIG. 7A, the signal at node R is the incident signal measured at the first measurement port, the signal at node A is the reflected signal measured at the first measurement port, and the signal at node B is the transmitted signal measured at the second measurement port. $S_{11}$, $S_{12}$, $S_{21}$ and $S_{22}$ represent the actual S-parameters of the DUT 702. The error terms are represented by $e_{00}$ (forward directivity (EDF)), $e_{11}$ (forward source match (ESF)), $e_{10}e_{01}$ (forward reflection tracking (ERF)), $e_{30}$ (forward cross isolation (EXF)), $e_{10}e_{32}$ (forward transmission tracking (ETF)) and $e_{22}$ (forward load match (ELF)).

From FIG. 7A it can be seen that the measured S-parameters ($S_{xyM}$) are related to the actual DUT S-parameters ($S_{xy}$) according to the following equations $$S_{11M} = \frac{A}{R} = e_{00} + (e_{10}e_{01})\frac{S_{11} - e_{22}\Delta_S}{1 - e_{11}S_{11} - e_{22}S_{22} + e_{11}e_{22}\Delta_S} \quad (14)$$

$$S_{21M} = \frac{B}{R} = e_{30} + (e_{10}e_{32})\frac{S_{21}}{1 - e_{11}S_{11} - e_{22}S_{22} + e_{11}e_{22}\Delta_S} \quad (15)$$

where $\Delta_S$ is equal to $S_{11}S_{22} - S_{21}S_{12}$.

In FIG. 7B, the signal at port A is the transmitted signal measured at the second measurement port, the signal at port R is the incident signal measured at the second measurement port and the signal at port B is the reflected signal measured at the first measurement port. $S_{11}$, $S_{12}$, $S_{21}$ and $S_{22}$ represent the actual S-parameters of the DUT 702. The error terms are represented by $e'_{33}$ (reverse directivity (EDR)), $e'_{11}$ (reverse load match (ELR)), $e'_{23}e'_{32}$ (reverse reflection tracking (ERR)), $e'_{03}$ (reverse cross isolation (EXR)), $e'_{23}e'_{01}$ (reverse transmission tracking (ETR)) and $e'_{22}$ (reverse source match (ESR)).

From FIG. 7B, it can be seen that the measured S-parameters ($S_{xyM}$) are related to the actual DUT S-parameters ($S_{xy}$) according to the following equations, $$S_{22M} = \frac{B}{R} = e'_{33} + (e'_{23}e'_{32})\frac{S_{22} - e'_{11}\Delta_S}{1 - e'_{11}S_{11} - e'_{22}S_{22} + e'_{11}e'_{22}\Delta_S} \quad (16)$$

$$S_{12M} = \frac{A}{R} = e'_{03} + (e'_{23}e'_{01})\frac{S_{12}}{1 - e'_{11}S_{11} - e'_{22}S_{22} + e'_{11}e'_{22}\Delta_S} \quad (17)$$

As stated above, if the twelve error terms are known equations (14), (15), (16) and (17) can be solved for the actual S-parameters of the DUT:

$$S_{11} = \frac{\left(\frac{S_{11M} - e_{00}}{e_{10}e_{01}}\right)\left[1 + \left(\frac{S_{22M} - e'_{33}}{e'_{23}e'_{32}}\right)e'_{22}\right] - e_{22}\left(\frac{S_{21M} - e_{30}}{e_{10}e_{32}}\right)\left(\frac{S_{12M} - e'_{03}}{e'_{23}e'_{01}}\right)}{D} \quad (18)$$

$$S_{21} = \frac{\left(\frac{S_{21M} - e_{30}}{e_{10}e_{32}}\right)\left[1 + \left(\frac{S_{22M} - e'_{33}}{e'_{23}e'_{32}}\right)(e'_{22} - e_{22})\right]}{D} \quad (19)$$

$$S_{22} = \frac{\left(\frac{S_{22M} - e'_{33}}{e'_{23}e'_{32}}\right)\left[1 + \left(\frac{S_{11M} - e_{00}}{e_{10}e_{01}}\right)e_{11}\right] - e'_{11}\left(\frac{S_{21M} - e_{30}}{e_{10}e_{32}}\right)\left(\frac{S_{12M} - e'_{03}}{e'_{23}e'_{01}}\right)}{D} \quad (20)$$

$$S_{12} = \frac{\left(\frac{S_{12M} - e'_{03}}{e'_{23}e'_{01}}\right)\left[1 + \left(\frac{S_{11M} - e_{00}}{e_{10}e_{01}}\right)(e_{11} - e'_{11})\right]}{D} \quad (21)$$

where D is equal to $$D = \left[1 + \left(\frac{S_{11M} - e_{00}}{e_{10}e_{01}}\right)e_{11}\right]\left[1 + \left(\frac{S_{22M} - e'_{33}}{e'_{23}e'_{32}}\right)e'_{22}\right] - \left(\frac{S_{21M} - e_{30}}{e_{10}e_{32}}\right)\left(\frac{S_{12M} - e'_{03}}{e'_{23}e'_{01}}\right)e_{22}e'_{11}$$

The two-port calibration along the calibration plane $A_5$-$A_5$ may be generated according to several well-established and published techniques, such as SOLT (Short Open Load Through), LRM (Line Reflect Match) or TRL (Through Reflect Line) or any other similar technique. Regardless of the specific technique chosen, each technique measures certain calibration components in order to solve the error contributions of the standard 12-term model. To solve for the 12 unknown quantities in the model equations, 12 independent measurements at the test ports must be made.

Table 1 provides a summary of the twelve error terms and common notations used to describe them. The first column shows the word description of the error term, the second column shows the standard two-port notation, and the fourth column shows the flow graph notation. The third column shows a slightly modified notation using indices rather than the forward (F) and reverse (R) designation. In the index notation, the second number describes the measurement port of the S-parameter measurement device to which the source signal is applied and the first number describes the measurement port of the S-parameter measurement device at which the signal is detected. This follows the S-parameter notation. One advantage to the index notation is that it can be generalized to S-parameter measurement devices with more than two measurement ports.

TABLE 1

| Description | Standard Two-Port Notation | Index Notation | Definition |
|---|---|---|---|
| Forward Cross Isolation | EXF | $EX_{21}$ | $e_{30}$ |
| Reverse Cross Isolation | EXR | $EX_{12}$ | $e'_{03}$ |
| Forward Directivity | EDF | $ED_{11}$ | $e_{00}$ |
| Reverse Directivity | EDR | $ED_{22}$ | $e'_{33}$ |
| Forward Reflection Tracking | ERF | $ER_{11}$ | $e_{01}e_{10}$ |
| Reverse Reflection Tracking | ERR | $ER_{22}$ | $e'_{23}e'_{32}$ |
| Forward Source Match | ESF | $ES_{11}$ | $e_{11}$ |
| Reverse Source Match | ESR | $ES_{22}$ | $e'_{22}$ |
| Forward Load Match | ELF | $EL_{21}$ | $e_{22}$ |
| Reverse Load Match | ELR | $EL_{12}$ | $e'_{11}$ |
| Forward Transmission Tracking | ETF | $ET_{21}$ | $e_{10}e_{32}$ |
| Reverse Transmission Tracking | ETR | $ET_{12}$ | $e'_{01}e'_{23}$ |

In the third stage of the initial calibration, one-port calibrations along the plane $B_5$-$B_5$ are generated for each port of the two-port DUT 508. Plane $B_5$-$B_5$ is referred to as the correction plane and, as shown in FIG. 5, lies between the tracking modules 520 and 504 and the S-parameter measurement device 502. In one embodiment the one-port calibrations along the correction plane $B_5$-$B_5$ are generated from the manufacturing S-parameters and the calibration S-parameters of the first and second tracking modules 504 and 520. Specifically, the three one-port error terms are determined from equations (2), (3) and (4) using the manufacturing S-parameters as the known reflection coefficients and the calibration S-parameters as the measured reflection coefficients.

In the fourth stage of the initial calibration, an error adapter for each port (516 and 518) of the two-port DUT 508 is calculated. Each error adapter is a model of the electrical distance between the calibration plane $A_5$-$A_5$ and the correction plane $B_5$-$B_5$ and can be represented by a set of two port S-parameters ($S_{11}$, $S_{12}$, $S_{21}$, $S_{22}$). In one embodiment the error adapters are calculated by differencing the two-port calibration along the calibration plane $A_5$-$A_5$ and the two one-port calibrations along the correction plane $B_5$-$B_5$.

Specifically, the S-parameters for the error adapter for the first DUT port 516 are determined from equations (9), (11), and (12). The parameters $EDF_1$, $ESF_1$ and $ERF_1$ are the one-port error terms generated from the S-parameters of the first tracking module 520. The parameters $EDF_2$, $ESF_2$ and $ERF_2$ are the EDF, ESF and ERF terms of the initial two-port calibration along the calibration plane $A_5$-$A_5$.

Similarly, the S-parameters for the error adapter for the second DUT port 518 are determined from equations (9), (11) and (12). The parameters $EDF_1$, $ESF_1$ and $ERF_1$ are the one-port error terms generated from the S-parameters of the second tracking module 504. The parameters $EDF_2$, $ESF_2$ and $ERF_2$ are the EDR, ESR and ERR terms of the initial two-port calibration along the calibration plane $A_5$-$A_5$.

After the initial calibration is determined, at (606) the first DUT port 516 is coupled to the second port 210 of the first tracking module 520, and the second DUT port 518 is coupled to the second port 210 of the second tracking module 504. Once the two-port DUT 508 has been coupled to the first and second tracking modules 520 and 504 the S-parameters of the two-port DUT 508 are measured.

After S-parameter measurement, at (608), the first and second tracking modules 520 and 504 track changes in the initial calibration. In one embodiment, tracking the changes in the initial calibration involves four stages. In the first stage, the S-parameter measurement device 502 measures the S-parameters of the three standards 202, 204 and 206 of the first and second tracking modules 520 and 504. These S-parameters will be referred to as the measurement S-parameters of the first and second tracking modules 520 and 504.

In the second tracking stage, one-port calibrations along the correction plane $B_5$-$B_5$ are re-generated for each port 516 and 518 of the two-port DUT 508. In one embodiment the one-port calibrations are generated from the manufacturing S-parameters and the measurement S-parameters of the first and second tracking modules 520 and 504. Specifically, the three one-port error terms are determined from equations (2), (3) and (4) using the manufacturing S-parameters as the known reflection coefficients and the measurement S-parameters as the measured reflection coefficients.

In the third tracking stage, a two-port calibration along the correction plane $B_5$-$B_5$ is generated. The two-port calibration along the correction plane $B_5$-$B_5$ is generated from the initial two-port calibration along the calibration plane $A_5$-$A_5$ and the two re-generated one-port calibrations along the correction plane $B_5$-$B_5$. A two-port calibration requires the generation of 12 error terms. Two of these terms, the isolation terms (EXF and EXR) can be ignored in most applications. Since the re-generated one-port calibrations along the correction plane $B_5$-$B_5$ only generate six error terms (EDF, ESF, ERF, EDR, ESR, and ERR) there are four error terms (ELF, ETF, ELR, and ETR) that must be generated in another manner.

In one embodiment, the four unknown error terms (ELF, ETF, ELR and ETR) are generated from the error terms of the re-generated one-port calibrations and S-parameter measurement device-specific terms that can be determined from the initial two-port calibration along the calibration plane $A_5$-$A_5$.

Specifically, the ELF and ELR terms are generated by defining a parameter, $\rho$, for each measurement port 512 and 514 of the S-parameter measurement device 502. The parameter, $\rho$, is defined as the ratio of the source signal to the reflected signal, which is a function of the internal configuration of the S-parameter measurement device 502. It will be shown that ELF and ELR can be generated from $\rho$ in combination with the error terms of the regenerated one-port calibrations along the correction plane $B_5$-$B_5$.

First, from FIG. 7A, the relationship between the signals at the first measurement port ($a_1$ and $b_1$) of the S-parameter measurement device 502 and the signals at the sampler ports (A and R) is given by equations (22) and (23).

$$A = e_{00}R + e_{01}a_1 \quad (22)$$

$$b_1 = e_{10}R + e_{11}a_1 \quad (23)$$

Next, if the measurement port is in its terminated condition as shown in FIG. 7B, then the ratio R/A takes a fixed value $\rho$ in equations (22) and (23), giving equations (24) and (25).

$$A = \frac{e_{01}a_1}{1 - e_{00}\rho} \quad (24)$$

$$b_1 = \left(e_{11} + \frac{e_{01}e_{10}\rho}{1 - e_{00}\rho}\right)a_1 \quad (25)$$

Then, from FIG. 7B, the port one error terms ($e'_{01}$ and $e'_{11}$) are given by equations (26) and (27).

$$e'_{01} = \frac{e_{01}}{1 - e_{00}\rho} \quad (26)$$

$$e'_{11} = e_{11} + \frac{e_{01}e_{10}\rho}{1 - e_{00}\rho} \quad (27)$$

Equation (27) can be written in a more generalized form in equation (28) where $\rho_i$ is the $\rho$ associated with the $i^{th}$ port.

$$EL_{ij} = ES_{ii} + \frac{ER_{ii}\rho_i}{1 - ED_{ii}\rho_i} \quad (28)$$

Since $ED_{ii}$, $ER_{ii}$ and $ES_{ii}$ are generated by the one-port calibrations, ELF and ELR can be determined according to equation (28) from the one-port calibrations and $\rho_1$ and $\rho_2$. Since $\rho_1$ and $\rho_2$ are invariant parameters, they can be determined from equation (28) from the error terms of the initial two-port calibration along the calibration plane $A_5$-$A_5$.

The ETF and ETR terms can be generated in a similar fashion by defining parameters $TR_{11}$ and $TR_{22}$. $TR_{11}$ is defined as the square root of the ratio between $e_{10}$ and $e_{01}$. $TR_{22}$ is the equivalent of $TR_{11}$ for port 2 and is defined as the square root of the ratio between $e'_{23}$ and $e'_{32}$. It is easily shown that these two ratios are independent of any cables or fixtures that may be attached to the S-parameter measurement device 502 if the cables and fixtures are reciprocal. The term reciprocal is used to mean that $S_{12}$ is equal to $S_{21}$. Accordingly, assuming reciprocity of the cables and fixtures, these two ratios can be regarded as function of the S-parameter measurement device 502 alone. It will be shown that ETF and ETR can be generated from $TR_{11}$, $TR_{22}$, $\rho_1$ and $\rho_2$ in combination with the error terms of the re-generated one-port calibrations along the correction plane $B_5$-$B_5$.

First, equations (26) and (27) can be rearranged to solve for $\rho$.

$$\rho = \frac{e'_{01} - e_{01}}{e'_{01}e_{00}} \quad (29)$$

$$\rho = \frac{e'_{11} - e_{11}}{e_{01}e_{10} + e_{00}(e'_{11} - e_{11})} \quad (30)$$

Next, equations (29) and (30) are equated to generated equation (31).

$$e'_{01}e_{10} = e_{01}e_{10} + e_{00}(e'_{11} - e_{11}) \quad (31)$$

The port 2 version of equation (31) is shown in equation (32).

$$e'_{23}e_{32} = e'_{23}e'_{32} + e'_{33}(e_{22} - e'_{22}) \quad (32)$$

Multiplying equations (31) and (32) produces the dependency condition between error parameters given in equation (33).

$$(e_{10}e_{32})(e'_{01}e'_{23}) = (e_{01}e_{10} + e_{00}(e'_{11} - e_{11}))(e'_{23}e'_{32} + e'_{33}(e_{22} - e'_{22})) \quad (33)$$

From equation (32), $(e_{10}e_{32})$ can be written as shown in equation (34).

$$(e_{10}e_{32}) = \sqrt{\left(\frac{e_{10}}{e_{01}}\right)} \sqrt{\left(\frac{e'_{32}}{e'_{23}}\right)} \frac{\sqrt{(e_{10}e_{01})}}{\sqrt{(e'_{23}e'_{32})}} (e'_{23}e_{32})$$

$$= \sqrt{\left(\frac{e_{10}}{e_{01}}\right)} \sqrt{\left(\frac{e'_{32}}{e'_{23}}\right)} \frac{\sqrt{(e_{10}e_{01})}}{\sqrt{(e'_{23}e'_{32})}} (e'_{23}e'_{32} + e'_{33}(e_{22} - e'_{22})) \quad (34)$$

Equation (34) can be generalized to equation (35).

$$ET_{ji} = \frac{TR_{ii}}{TR_{jj}} \frac{\sqrt{ER_{ii}}}{\sqrt{ER_{jj}}} (ER_{jj} + ED_{jj}(EL_{ji} - ES_{jj}))$$

$$= \frac{TR_{ii}}{TR_{jj}} \frac{\sqrt{ER_{ii}}\sqrt{ER_{jj}}}{(1 - ED_{jj}\rho_j)} \quad (35)$$

Since $ED_{ii}$, $ER_{ii}$ and $ES_{ii}$ are generated by the one-port calibrations, ETF and ETR can be determined according to equation (35) from the re-generated one-port calibrations along the correction plane $B_5$-$B_5$, $\rho$, and the ratio $TR_{ii}/TR_{jj}$. Since both $TR_{ii}$ and $TR_{jj}$ are invariant parameters, the ratio between them is also invariant and thus can be determined according to equation (35) from the error terms of the original two-port calibration along the calibration plane $A_5$-$A_5$. The sign of the square root terms may be determined according to the extrapolation method described above.

In another embodiment, the four unknown error terms (ELF, ETF, ELR and ETR) are generated by defining a correction plane error adapter for each port of the test system. Each correction plane error adapter is defined by a set of two-port S-parameters ($S_{11}$, $S_{12}$, $S_{21}$, $S_{22}$) and represents the change along the correction pane between the original one-port calibration along the correction plane and the re-generated one-port calibration along the correction plane. If the error terms of the original one-port calibrations along the correction plane $B_5$-$B_5$ are designated $EDF_1$, $ERF_1$, and $ESF_1$ and the error terms of the re-regenerated one-port calibrations along the correction plane $B_5$-$B_5$ are designed $EDF_2$, $ERF_2$, and $ESF_2$ then the error adapter S-parameters can be defined by equations (9), (11) and (12).

Replacing $\rho$ in equation (28) with its equivalent error term representation, generates the following equation for $EL_{ij}$ where $ER_{ii}$, $EL_{ij}$, $ES_{ii}$ and $ED_{ii}$ are the error terms of the two-port calibration along the correction plane $B_5$-$B_5$, $ER_{ii}^0$, $EL_{ij}^0$, $ES_{ii}^0$, and $ED_{ii}^0$ are the error terms of the initial two-port calibration along the calibration plane $A_5$-$A_5$, and $s_{xy}^i$ are the S-parameters of the correction plane error adapter for the $i^{th}$ port.

$$EL_{ij} = ES_{ii} + \frac{ER_{ii}(EL_{ij}^0 - ES_{ii}^0)}{ER_{ii}^0 + (EL_{ij}^0 - ES_{ii}^0)(ED_{ii}^0 - ED_{ii})}$$

$$= ES_{ii} + \frac{ER_{ii}(EL_{ij}^0 - ES_{ii}^0)}{(ER_{ii}^0 + ES_{ii}^0(ED_{ii} - ED_{ii}^0))(1 - EL_{ij}^0 s_{11}^i)}$$

$$= s_{22}^i + \frac{ER_{ii}EL_{ij}^0(1 - s_{11}^i ES_{ii}^0)}{(ER_{ii}^0 + ES_{ii}^0(ED_{ii} - ED_{ii}^0))(1 - s_{11}^i EL_{ij}^0)}$$

$$= s_{22}^i + \frac{s_{12}^i s_{21}^i EL_{ij}^0}{(1 - s_{11}^i EL_{ij}^0)} \quad (36)$$

Replacing ρ and $TR_{11}/TR_{22}$ in equation (34) with their equivalent error term representations, generates the following equation for $ET_{ji}$:

$$ET_{ji} = ET_{ji}^0 \sqrt{\frac{ER_{ii}}{ER_{ii}^0}} \sqrt{\frac{ER_{jj}^0}{ER_{jj}}} \frac{(ER_{jj} + ED_{jj}(EL_{ji} - ES_{jj}))}{(ER_{jj}^0 + ED_{jj}^0(EL_{ji}^0 - ES_{jj}^0))} \quad (37)$$

$$= ET_{ji}^0 \sqrt{\frac{ER_{ii}}{ER_{ii}^0}} \sqrt{\frac{ER_{jj}^0}{ER_{jj}}} \frac{EL_{ji} - ES_{jj}}{EL_{ji}^0 - ES_{jj}^0}$$

$$= ET_{ji}^0 \frac{s_{21}^i}{1 - s_{11}^i ES_{ii}^0} \sqrt{\frac{ER_{jj}^0}{ER_{jj}}} \frac{EL_{ji} - ES_{jj}}{EL_{ji}^0 - ES_{jj}^0}$$

$$= ET_{ji}^0 \frac{s_{21}^i}{1 - s_{11}^i ES_{ii}^0} \sqrt{\frac{ER_{jj}^0}{ER_{jj}}}$$

$$\frac{ER_{jj}}{ER_{jj}^0 + (EL_{ji}^0 - ES_{jj}^0)(ED_{jj}^0 - ED_{jj})}$$

Since the following is true, $$\frac{1 - s_{11}^j ES_{jj}^0}{1 - s_{11}^j EL_{ji}^0} = \frac{ER_{jj}^0}{ER_{jj}^0 + (ES_{jj}^0 - EL_{ji}^0)(ED_{jj} - ED_{jj}^0)}$$

equation (37) can be re-written as equation (38).

$$ET_{ji} = ET_{ji}^0 \frac{s_{21}^i}{1 - s_{11}^i ES_{ii}^0} \sqrt{\frac{ER_{jj}^0}{ER_{jj}}} \quad (38)$$

$$\frac{ER_{jj}}{ER_{jj}^0 + (EL_{ji}^0 - ES_{jj}^0)(ED_{jj}^0 - ED_{jj})}$$

$$= ET_{ji}^0 \frac{s_{21}^i}{1 - s_{11}^i ES_{ii}^0} \sqrt{\frac{ER_{jj}}{ER_{jj}^0}} \frac{1 - s_{11}^j ES_{jj}^0}{1 - s_{11}^j EL_{ji}}$$

$$= ET_{ji}^0 \frac{s_{21}^i}{1 - s_{11}^i ES_{ii}^0} \frac{s_{12}^j}{1 - s_{11}^j EL_{ji}^0}$$

From equations (36) and (38) the ELF, ELR, ETF and ETR terms of the two-port calibration along the correction plane $B_5$-$B_5$ can be generated from the ELF, ELR, ETF and ETR terms of the initial two-port calibration along the correction plane $B_5$-$B_5$ using adapters representing changes in the one port error terms between the original and re-generated one-port calibrations along the correction plane $B_5$-$B_5$. Equivalently, the same terms referred to the calibration plane $A_5$-$A_5$ can be generated from the initial terms at the calibration plane $A_5$-$A_5$ and adapters representing changes in the one port error terms between the original and re-generated one-port calibrations along the calibration plane $A_5$-$A_5$.

Once the two-port calibration along the correction plane $B_5$-$B_5$ has been generated, the method moves to the fourth tracking stage where a corrected two-port calibration along the calibration plane $A_5$-$A_5$ is generated. The corrected two-port calibration along the calibration plane $A_5$-$A_5$ is generated from the two-port calibration along the correction plane $B_5$-$B_5$ and the error adapters.

In one embodiment the corrected calibration along the calibration plane $A_5$-$A_5$ is generated by adding the error adapters to the two-port calibration along the correction plane $B_5$-$B_5$. Specifically, the EDF, ESF and ERF terms of the corrected calibration along the calibration plane $A_5$-$A_5$ are determined from equations (6), (7) and (8) where $EDF_1$, $ESF_1$ and $ERF_1$ are the EDF, ESF and ERF terms from the two-port calibration along the correction plane $B_5$-$B_5$, and $S_{11}$, $S_{12}$, $S_{21}$ and $S_{22}$ are the S-parameters of the first error adapter. The EDR, ESR and ERR terms are also determined from equations (6), (7) and (8) respectively where $EDF_1$, $ESF_1$ and $ERF_1$ are the EDR, ESR and ERR terms from the two-port calibration along the correction plane $B_5$-$B_5$, and $S_{11}$, $S_{12}$, $S_{21}$ and $S_{22}$ are the S-parameters of the second error adapter. In addition, the ELF, ETF, ELR and ETR terms of the corrected calibration along the calibration plane $A_5$-$A_5$ are determined from equations (39), (40), (41) and (42) respectively:

$$ELF_2 = S_{22(A2)} + \frac{ELF_1 S_{12(A2)} S_{21(A2)}}{1 - ELF_1 S_{11(A2)}} \quad (39)$$

$$ETF_2 = \frac{(ETF_1 S_{21(A1)} S_{12(A2)})}{((1 - ELF_1 S_{11(A2)})(1 - ESF_1 S_{11(A1)}))} \quad (40)$$

$$ELR_2 = S_{22(A1)} + \frac{ELR_1 S_{12(A1)} S_{21(A1)}}{1 - ELF_1 S_{11(A1)}} \quad (41)$$

$$ETR_2 = \frac{(ETR_1 S_{12(A1)} S_{21(A2)})}{((1 - ELR_1 S_{11(A1)})(1 - ESR_1 S_{11(A2)}))} \quad (42)$$

where $ELR_1$, $ETF_1$, $ELR_1$ and $ETR_1$ are the ELR, ETR, ELR and ETR terms from the two-port calibration along the correction plane $B_5$-$B_5$, $S_{xy(A1)}$ are the S-parameters from the first adapter and $S_{xy(A2)}$ are the S-parameters from the second adapter. Equations (39), (40), (41) and (42) follow immediately from the general equations (36) and (38).

Where waveguide ports are involved in the phase of the ETF and ETR terms, the phase of the ETF and ETR terms of the corrected calibration along the calibration plane $A_5$-$A_5$ may be aligned to the phase of the ETF and ETR terms of the initial two-port calibration along the calibration plane $A_5$-$A_5$.

After the changes have been tracked, at (610) the measured S-parameters are corrected. In one embodiment, correcting the measured S-parameters includes using the error terms of the corrected two-port calibration along the calibration plane $A_5$-$A_5$ to generate the actual S-parameters from equations (18), (19), (20) and (21).

Figure 8:
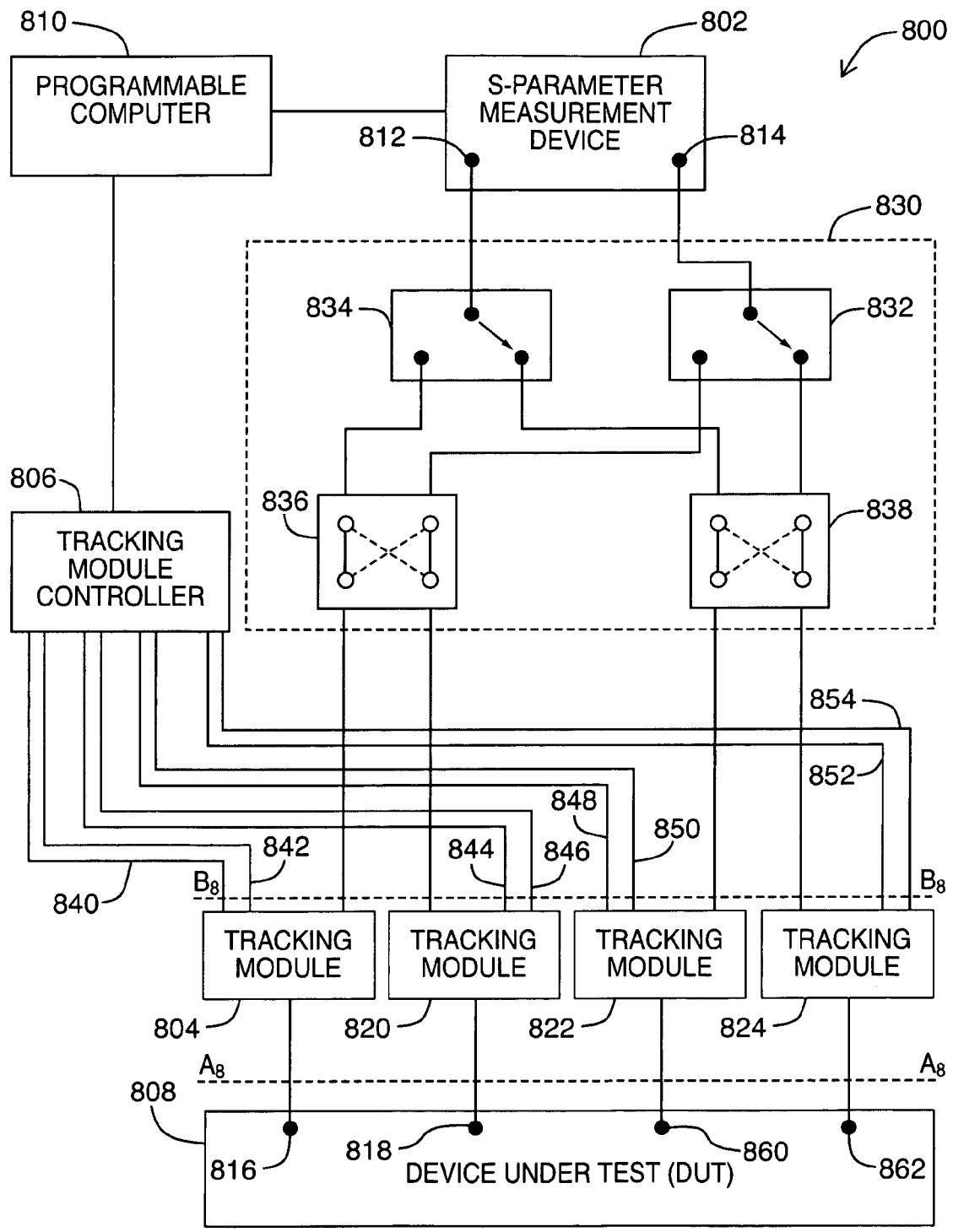
FIG. 8 is a block diagram of a system for measuring the S-parameters of a multi-port device under test in accordance with at least one embodiment.

Reference is now made to FIG. 8, in which a system 800 for dynamically correcting S-parameter measurements of a multi-port DUT 808 in accordance with an embodiment is illustrated. The system 800 includes a S-parameter measurement device 802, four tracking modules 804, 820, 822 and 824, a tracking module controller 806, a multi-port DUT 808, a programmable computer 810 and a switch matrix 830.

The S-parameter measurement device 802, the tracking modules 804, 820, 822 and 824, the tracking module controller 806 and the programmable computer 810 are operable as described in relation to FIG. 1.

In the embodiment shown in FIG. 8 the multi-port DUT 808 has four ports 816, 818, 860 and 862 and the S-parameter measurement device has two measurement ports 812 and 814. Since the S-parameter measurement device 802 has only two measurement ports 812 and 814 and the multi-port DUT 808 has more than two ports, a switch matrix 830 is inserted between the S-parameter measurement device 802 and the multi-port DUT 808. The S-parameter measurement device 802 measures the S-parameters of the multi-port DUT 808 by setting the switch matrix 830 to couple the two measurement ports 812 and 814 of the S-parameter measurement device 802 to two ports (e.g. 816 and 818) of the multi-port DUT 808.

In the embodiment shown in FIG. 8 the switch matrix 830 includes two 1×2 switches 832 and 834 and two transfer switches 836 and 838. This enables the two-port S-parameter measurement device 802 to measure the 4-port DUT 808. However, the configuration of the switch matrix 830 may be modified to expand the number of ports that can be measured by the S-parameter measurement device 802. For example, the switch matrix 830 may further include four 1×6 switches, two of which are connected to the first transfer switch 836 and two of which are connected to the second transfer switch 838. Note however, that for every port of the DUT that is to be measured by the S-parameter measurement device 802 there must be a tracking module situated between the DUT port and the switch matrix 830 and each tracking module must be connected to and controlled by the tracking module controller 806.

The method 600 describing a procedure to dynamically correct S-parameter measurements of a two-port DUT using the system 500 of FIG. 5 can also be applied to system 800, or variations of system 800 as described above, to dynamically correct S-parameter measurements of a multi-port DUT. To clarify how method 600 can be used to correct S-parameter measurements of a multi-port DUT, method 600 as applied to system 800 will be briefly described.

The first part of the method is to couple the first port 208 of each of the tracking modules 804, 820, 822 and 824 to a port of the switch matrix 830. Together the S-parameter measurement device 802, the switch matrix 830 and the tracking modules 804, 820, 822 and 824 form a multi-port S-parameter test system.

The second part of the method is to determine an initial calibration for the multi-port S-parameter test system. In one embodiment determining the initial calibration includes four stages. In the first stage the S-parameter measurement device measures the S-parameters for the three electrical standards 202, 204 and 206 of each tracking module 804, 820, 822 and 824. These S-parameters will be referred to as the calibration S-parameters. In the second stage an initial full two-port calibration along the calibration plane is generated. Generating a full two-port calibration along the calibration plane involves generating the 12 two-port error terms for each two-port combination of interest of the multi-port DUT 808. A two-port combination of interest can be described as a combination of two ports of interest where a port of interest is a port that is to be measured/characterized. For example, a multi-port DUT 808 may have 10 ports, but only 5 of those need to be measured/characterized. The calibration plane $A_8$-$A_8$, as shown in FIG. 8, lies between the tracking modules 804, 820, 822 and 824 and the multi-port DUT 808. The full two-port calibration along the calibration plane $A_8$-$A_8$ may be generated in accordance with any known two-port calibration method.

In the third stage, one-port calibrations along the plane $B_8$-$B_8$ are generated for each port of interest of the multi-port DUT 808. The plane $B_8$-$B_8$ is referred to as the correction plane and, as shown in FIG. 8, lies between the tracking modules 804, 820, 822 and 824 and the switch matrix 830. In one embodiment the one-port calibrations along the correction plane $B_8$-$B_8$ are generated from the manufacturing S-parameters and the calibration S-parameters using equations (2), (3) and (4).

In the fourth stage, error adapters are generated for each port of interest of the multi-port DUT 808. The error adapters are generated by differencing the one-port calibrations along the correction plane $B_8$-$B_8$ and the initial full two-port calibration along the calibration plane $A_8$-$A_8$. Specifically, the S-parameters for each error adapter are determined from equations (9), (11), and (12). The parameters $EDF_1$, $ESF_1$ and $ERF_1$ are the one-port error terms generated from the S-parameters of the tracking module associated with that port (i.e. 804, 820, 822, 824). The parameters $EDF_2$, $ESF_2$ and $ERF_2$ are the EDF, ESF and ERF or EDR, ESR, and ERR terms of the initial full two-port calibration along the calibration plane $A_8$-$A_8$ depending on whether the DUT port was designated the first or second port of the pair during calibration. Where the DUT port was designated the first port of the pair then EDF, ESF and ERF will be used. Conversely, where the DUT port was designated the second port of the pair, EDR, ESR and ERR will be used.

The third part of the method is to couple each port of interest of the multi-port DUT 808 to the second port 210 of a tracking module 804, 820, 822 and 824 and to measure the S-parameters of the multi-port DUT 808.

The fourth part of the method is to track calibration changes. In one embodiment, tracking involves four stages. In the first stage the S-parameter measurement device 802 measures the S-parameters for the three electrical standards 202, 204 and 206 of each tracking module 804, 820, 822 and 824. These S-parameters will be referred to as the measurement S-parameters. In the second stage one-port calibrations along the correction plane $B_8$-$B_8$ are generated for each port of interest of the multi-port DUT 808. The one-port calibrations are generated from the manufacturing S-parameters and the measurement S-parameters using equations (2), (3) and (4). In the third stage a full two-port calibration along the correction plane $B_8$-$B_8$ is generated. The full two-port calibration along the correction plane $B_8$-$B_8$ is generated from the one-port calibrations along the correction plane $B_8$-$B_8$ generated in the second stage, and the initial full two-port calibration along the calibration plane $A_8$-$A_8$. The full two-port calibration along the correction plane $B_8$-$B_8$ may be generated in accordance with either of the embodiments described in relation to method 600. In the fourth stage a corrected full two-port calibration along the calibration plane $A_8$-$A_8$ is determined from the full two-port calibration along the correction plane $B_8$-$B_8$ and the error adapters.

The fifth part of the method is correcting the S-parameter measurements made in part three using the corrected full two-port calibration along the calibration plane $A_8$-$A_8$.

Where the multi-port DUT 808 has N ports and the S-parameter measurement device 802 has M ports and M is less than N, an additional complication may arise because during any S-parameter measurement only M DUT ports are connected to the S-parameter measurement device 802, and the remaining N-M ports are terminated by the switch matrix 830. The terminated impedances presented by the switch matrix 830 may deviate considerably from their ideal values, due both to inaccuracies in the switch matrix 830 terminations, and to the effects of the cables and fixtures. Failure to take account of this can result in significant errors in the corrected S-parameters.

In some embodiments the method 600 includes additional stages to account for terminating impedance deviations. Specifically, the initial calibration further includes the stage of capturing the load match of the DUT ports. In one embodiment the DUT ports would be mated in pairs where each port is a member of at least one pair. In each pair, one port at a time would be terminated and its impedance would then be measured from the other port.

In this embodiment the method 600 also includes a sixth part referred to as the impedance correction part. In the impedance correction part, the tracking modules are used to correct the initial impedance measurements. Once the actual impedances are determined one of the well-established procedures for correcting the effects of the non-ideal terminations is applied to the corrected S-parameters.

Specifically, a corrected reflection coefficient, $\Gamma_i$, for the i$^{th}$ port is determined from equation (36) where $\Gamma_i^0$ is the initial reflection coefficient and $S_{11}^i$, $S_{12}^i$, $S_{21}^i$, and $S_{22}^i$ are the S-parameters of an adapter for the i$^{th}$ port representing changes in the one port error terms between the original and re-generated one-port calibrations along the calibration plane $A_8$-$A_8$.

$$\Gamma_i = S_{22}^i + \frac{S_{12}^i S_{21}^i \Gamma_i^0}{(1 - S_{11}^i \Gamma_i^0)} \quad (36)$$

Note that this does not correct for deviations caused by switch repeatability within the switch matrix, because, when terminated, the port is necessarily in a different state from the one used to determine the error adapters. However, variations in the cables and fixtures are properly corrected.

Once the corrected reflection coefficients are generated a well-known procedure for correcting the effects of non-ideal terminations is applied to the corrected S-parameters. In one embodiment N-port correction is applied to the corrected S-parameters. The N-port correction procedure uses two types of S-matrix representation: the first is an S-matrix normalized to the ideal port impedances, and the second is an S-matrix normalized to the actual load impedances that are presented to the DUT by the test system. These representations are equivalent, and one can be obtained from the other using a mathematical transformation.

N-port correction can be divided into four stages. In the first stage sufficient S-parameter measurements are made to provide all N$^2$ elements of a N-Port S-matrix. For example, a two-port measurement made between ports 3 and 5 of the DUT provides elements $S_{33}$, $S_{35}$, $S_{53}$, and $S_{55}$ of the full N-port Matrix. In the second stage, all of the M-port matrices determined in the first stage are converted from their ideal normalizations to their load impedance normalizations. In the third stage, the S-parameters of the converted M-port matrices are inserted into their appropriate positions in the N-port S-matrix that is normalized to the actual load impedances. In the fourth stage the N-port S-matrix is converted to an equivalent N-Port S-matrix normalized to the ideal impedances.

In one embodiment the DUT 508 of system 500 is a frequency translation device. A frequency translation device, such as a mixer, converts signals at one frequency to another frequency. Frequency translation devices present unique challenges to S-parameter measurement system calibration. Specifically, when a S-parameter measurement device makes a measurement, the measurement is taken at the same frequency as the frequency of the test signal. Since the output frequency of a frequency translation device is different than the input, ordinary measurements cannot be used. Accordingly, the method for measuring and correcting S-parameters must be adjusted for frequency translation DUTs.

In one embodiment a method for measuring and correcting S-parameters of a two-port frequency translation DUT 508 using system 500 has four parts. In the first part the first ports 208 of the tracking modules 520 and 504 are coupled to the first and second ports 512 and 514 of the S-parameter measurement device 502. Together the S-parameter measurement device 502 and the tracking modules 504 and 520 form a two-port S-parameter test system.

In the second part, an initial calibration for the two-port S-parameter test system is determined. Determining the initial calibration can be broken down into four stages. In the first calibration stage, the S-parameter measurement device 502 measures the S-parameters for the three electrical standards 202, 204, 206 of the tracking modules 504 and 520. These S-parameters will be referred to as the calibration S-parameters of the tracking modules 504 and 520.

In the second stage of the initial calibration, a two-port calibration along the calibration plane $A_5$-$A_5$ is generated. A two-port calibration for a frequency translation DUT cannot be generated in the same manner as for a linear device. However, there are several known methods, such as Vector-Mixer Calibration (VMC), for generating a two-port calibration for a frequency translation DUT. One VMC method is described in detail in U.S. Pat. No. 6,995,571 (Liu et al.) and is herein incorporated by reference.

In the third stage of the initial calibration, one-port calibrations along the correction plane $B_5$-$B_5$ are generated for each port of the DUT 508. In one embodiment the one-port calibrations along the correction plane $B_5$-$B_5$ are generated from the manufacturing S-parameters and the calibration S-parameters. Specifically, the three one-port error terms are determined from equations (2), (3) and (4) using the manufacturing S-parameters as the known reflection coefficients and the calibration S-parameters as the measured reflection coefficients.

In the fourth stage of the initial calibration, error adapters are calculated for each port of the DUT 508. Each error adapter represents the electrical distance between the calibration plane $A_5$-$A_5$ and the correction plane $B_5$-$B_5$. In one embodiment the error adapters are calculated by differencing the one port calibrations along the correction plane $B_5$-$B_5$ from the two-port calibration along the calibration plane $A_5$-$A_5$. Specifically the S-parameters of the error adapters are generated from equations (9), (11) and (12) as described in relation to method 600.

Once the initial calibration is complete the method moves into the third part. In the third part each DUT port 516 and 518 is coupled to a second port 210 of a tracking module 504 and 520 and the S-parameters of the DUT 508 are measured.

In the fourth part the tracking modules 504 and 520 track changes in the initial calibration. Tracking the initial calibration can be broken down into five stages. In the first stage, the S-parameter measurement device 502 measures the S-parameters of the three standards 202, 204, and 206 of the tracking modules 504 and 520. These parameters will be referred to as the measurement S-parameters of the tracking modules 504 and 520.

In the second tracking stage, one-port calibrations along the correction plane $B_5$-$B_5$ are re-generated for each port of the DUT 508 from the manufacturing S-parameters and the measurement S-parameters of the tracking modules 504 and 520. Specifically, the three-one-port error terms are determined from equations (2), (3) and (4) using the manufacturing S-parameters as the known reflection coefficients and the measurement S-parameters as the measured reflection coefficients.

In the third tracking stage one-port calibrations along the calibration plane $A_5$-$A_5$ are generated from the one-port calibrations along the correction plane $B_5$-$B_5$ from the previous stage and the error adapters from the initial calibration. In one embodiment the one-port calibrations along the calibration plane $A_5$-$A_5$ are generated by adding the error adapters to the one-port calibrations along the correction plane $B_5$-$B_5$.

In the fourth tracking stage ELF and ETF error terms along the calibration plane $A_5$-$A_5$ are generated. To generate the ELF and ETF error terms, the initial two-port calibration along the calibration plane $A_5$-$A_5$ is differenced from the re-generated one-port calibrations along the calibration plane $A_5$-$A_5$ to produce difference S-parameters for each port. The difference S-parameters are then de-embedded from the original two-port calibration along the calibration plane $A_5$-$A_5$ to produce a new two-port calibration. It is the ELF and ETF terms thus generated that are designated as the ELF and ETF error terms along the calibration plane $A_5$-$A_5$.

In the fifth tracking stage a corrected two-port calibration along the calibration plane $A_5$-$A_5$ is generated. In one embodiment the corrected two-port calibration along the calibration plane $A_5$-$A_5$ is generated from the synthesis of the one-port calibrations along the calibration plane generated in the third tracking stage, the ELF and ETF error terms along the calibration plane $A_5$-$A_5$ generated in the fourth tracking stage, and setting the ELR error term to 0 and setting the ETR error term to 1. As with the method 500, the isolation terms (EXF and EXR) are ignored.

In one embodiment the system may additionally be able to assess how much the test system has changed since the initial calibration. In one embodiment this is done by relating the performance of the test system to its directivity. The directivity is the ability to discriminate the signal reflected from the signal injected.

Accordingly, the quality of the test system can be computed and tracked by determining the difference between the EDF or EDR terms of the one-port calibrations along the calibration plane $B_5$-$B_5$ measured in decibels (dB) and the EDF or EDR terms of the initial two-port calibration along the calibration plane $A_5$-$A_5$ also measured in dB. The difference between EDF or EDR terms can be computed each time one-port calibrations along the correction plane $B_5$-$B_5$ are generated and changes in the difference will reflect test system changes. An abrupt change in the difference without a cable change indicates a degradation of the calibration.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto.

The invention claimed is:

1. A method of correcting S-parameter measurements for a device under test (DUT) using a S-parameter measurement device comprising:
    coupling a plurality of tracking modules to a plurality of ports of the S-parameter measurement device to form a S-parameter test system, each tracking module being associated with a set of electrical standards characterized by a first set of S-parameters;
    determining an initial calibration for the S-parameter test system;
    coupling the device under test (DUT) to the S-parameter test system and measuring the S-parameters of the device under test (DUT) using the S-parameter test system;
    tracking changes in the initial calibration during measurement using the electrical standards of the tracking modules; and
    correcting the measured S-parameters using the tracked changes.

2. The method of claim 1, wherein determining the initial calibration comprises:
    determining a second set of S-parameters for each set of electrical standards,;
    generating an initial full two-port calibration along a calibration plane wherein the calibration plane lies between the tracking modules and the device under test (DUT);
    generating a first one-port calibration along a correction plane for each port of interest of the device under test (DUT) based on the first set of S-parameters and the second set of S-parameters wherein the correction plane lies between the tracking modules and the S-parameter measurement device; and
    calculating an error adapter for each port of interest of the device under test (DUT) based on the initial full two-port calibration along the calibration plane and the first one-port calibrations along the correction plane.

3. The method of claim 2, wherein tracking changes in the initial calibration comprises:
    determining a third set of S-parameters for each set of electrical standards;
    generating a second one-port calibration along the correction plane for each port of interest of the device under test (DUT) based on the first set of S-parameters and the third set of S-parameters;
    determining a full two-port calibration along the correction plane based on the second one-port calibrations along the correction plane and the initial full two-port calibration along the calibration plane; and
    generating a corrected full two-port calibration along the calibration plane based on the full two-port calibration along the correction plane and the error adapters.

4. The method of claim 3 wherein the corrected full two-port calibration along the calibration plane and the initial two-port calibration along the calibration plane comprise ETF and ETR error terms with associated phases, and generating a corrected full two-port calibration along the calibration plane includes aligning the phases of the ETF and ETR terms of the corrected full two-port calibration along the calibration plane with the phases of ETF and ETR terms of the initial full two-port calibration along the calibration plane.

5. The method of claim 3 wherein the full two-port calibration along the correction plane comprises ELF, ELR, ETF, and ETR error terms, and determining the full two-port calibration along the correction plane comprises determining ELF, ELR, ETF and ETR based on a plurality of S-parameter measurement device specific parameters and the second one port calibrations along the correction plane.

6. The method of claim 5, wherein the plurality of S-parameter measurement device specific parameters are generated from the initial full two-port calibration along the calibration plane.

7. The method of claim 6 wherein the plurality of S-parameter measurement device specific parameters include:

$$\rho_i = \frac{EL_{ij} - ES_{ii}}{ER_{ii} + ED_{ii}(EL_{ij} - ES_{ii})}$$

$$\frac{TR_{ii}}{TR_{jj}} = \frac{ET_{ji}(1 - ED_{jj}\rho_j)}{\sqrt{ER_{ii}}\sqrt{ER_{jj}}}$$

8. The method of claim 7 wherein the ELF and ELR terms are generated from the following formula:

$$EL_{ij} = ES_{ii} + \frac{ER_{ii}\rho_i}{1 - ED_{ii}\rho_i}$$

9. The method of claim 7 wherein the ETF and ETR error terms are generated from the following formula:

$$ET_{ji} = \frac{TR_{ii}}{TR_{jj}} \frac{\sqrt{ER_{ii}} \sqrt{ER_{jj}}}{(1 - ED_{jj}\rho_j)}$$

10. The method of claim 3 wherein the full two-port calibration along the correction plane comprises ELF, ELR, ETF, and ETR error terms, and determining the full two-port calibration along the correction plane comprises determining ELF, ELR, ETF and ETR based on a plurality of correction plane error adapters wherein each correction plane error adapter represents the difference between a first one port calibration along the correction plane and a second one port calibration along the correction plane.

11. The method of claim 10 wherein the ELF and ELR error terms of the full two port calibration along the correction plane are generated in accordance with the following formula:

$$EL_{ij} = s_{22}^i + \frac{s_{12}^i s_{21}^i EL_{ij}^0}{(1 - s_{11}^i EL_{ij}^0)}$$

12. The method of claim 10 wherein the ETF and ETR error terms of the full two port calibration along the correction plane are generated in accordance with the following formula:

$$ET_{ji} = ET_{ji}^0 \frac{s_{21}^i}{1 - s_{11}^i ES_{ii}^0} \frac{s_{12}^j}{1 - s_{11}^j EL_{ji}^0}$$

13. The method of claim 3, wherein correcting the measured S-parameters comprises applying the corrected full two-port calibration along the calibration plane to the measured S-parameters.

14. The method of claim 13, wherein determining the initial calibration further comprises capturing a first load match for each port of interest of the test system; and the method further comprises determining a second load match for each port of interest of the test system based on the second one port calibrations along the correction plane and the error adapters, and adjusting the corrected S-parameters based on the second load matches.

15. The method of claim 14 wherein adjusting the corrected S-parameters comprises applying N-port correction to the corrected S-parameters.

16. The method of claim 2, wherein the device under test is a frequency translation device and tracking changes in the initial calibration comprises:

determining a third set of S-parameters for each set of electrical standards;

generating a second one-port calibration along the correction plane for each port of interest of the device under test (DUT) based on the first set of S-parameters and the third set of S-parameters;

generating a one-port calibration along the calibration plane for each port of interest of the device under test (DUT) based on the second one port calibrations along the correction plane and the error adapters;

generating ELF and ETF error terms along the calibration plane based on the initial full two-port calibration along the calibration plane and the one-port calibrations along the calibration plane; and generating a corrected full two-port calibration along the calibration plane based on the one-port calibrations along the calibration plane and the ELF and ETF error terms along the calibration plane.

17. The method of claim 16 wherein generating the ELF and ETF error terms along the calibration plane comprises:

generating difference S-parameters for each port of interest of the device under test (DUT) by differencing the initial full two-port calibration along the calibration plane and the one-port calibrations along the calibration plane; and de-embedding the difference S-parameters from the initial full two-port calibration along the calibration plane.

18. The method of claim 16 wherein generating the corrected full two-port calibration along the calibration plane includes setting the ELR term to zero and setting the ETR term to one.

19. A method of correcting S-parameter measurements for a device under test (DUT) using a S-parameter measurement device comprising:

coupling a tracking module to a port of the S-parameter measurement device to form a S-parameter test system wherein the tracking module is associated with a plurality of electrical standards characterized by a first set of S-parameters;

determining an initial calibration for the S-parameter test system;

coupling the device under test (DUT) to the S-parameter test system and measuring the S-parameters of the device under test (DUT);

tracking changes in the initial calibration during measurement using the plurality of electrical standards of the tracking module; and correcting the measured S-parameters using the tracked changes.

20. The method of claim 19, wherein determining the initial calibration includes:

determining a second set of S-parameters for the plurality of electrical standards;

determining a one-port calibration along a calibration plane wherein the calibration plane lies between the tracking module and the device under test (DUT);

determining a first one-port calibration along a correction plane based on the first set of S-parameters and the second set of S-parameters wherein the correction plane lies between the tracking module and the S-parameter measurement device; and calculating an error adapter based on the one-port calibration along the calibration plane and the first one-port calibration along the correction plane.

21. The method of claim 20, wherein tracking changes in the initial calibration includes:

determining a third set of S-parameters for the plurality of electrical standards;

determining a second one-port calibration along the correction plane based on the first set of S-parameters and the third set of S-parameters; and generating a corrected one-port calibration along the calibration plane based on the second one-port calibration along the correction plane and the error adapter.

22. The method of claim 21, wherein correcting the measured S-parameters comprises applying the corrected one-port calibration along the calibration plane to the measured S-parameters.

23. A system for correcting S-parameter measurements of a device under test (DUT) comprising:
- a S-Parameter measurement device;
- a tracking module coupled to the measurement device wherein the tracking module is associated with a plurality of electrical standards;
- a tracking module controller for controlling the tracking module;
- a device under test removeably coupled to the tracking module; and
- a programmable computer programmed to
  - determine an initial calibration for the S-parameter test system;
  - measure the S-parameters of the device under test (DUT);
  - track changes in the initial calibration during measurement using the plurality of electrical standards of the tracking module; and
  - correct the measured S-parameters using the tracked changes.

24. A system for correcting S-parameter measurements of a device under test (DUT) comprising:
- a S-Parameter measurement device;
- a plurality of tracking modules coupled to the S-parameter measurement device to form a S-parameter test system wherein each tracking module is associated with a plurality of electrical standards;
- a tracking module controller for controlling the tracking module;
- a device under test removeably coupled to the tracking modules; and
- a programmable computer programmed to
  - determine an initial calibration for the S-parameter test system;
  - measure the S-parameters of the device under test (DUT) using the S-parameter test system;
  - track changes in the initial calibration during measurement using the electrical standards of the tracking modules; and
  - correct the measured S-parameters using the tracked changes.

25. The system of claim 23 further comprising a switch matrix situated between the S-Parameter measurement device and the tracking module controllers.

* * * * *